(12) United States Patent
Smith et al.

(10) Patent No.: US 9,099,449 B2
(45) Date of Patent: Aug. 4, 2015

(54) RESILIENT ELECTRICAL INTERPOSERS, SYSTEMS THAT INCLUDE THE INTERPOSERS, AND METHODS FOR USING AND FORMING THE SAME

(71) Applicant: Cascade Microtech, Inc., Beaverton, OR (US)

(72) Inventors: Kenneth R. Smith, Beaverton, OR (US); Mike Jolley, Beaverton, OR (US); Eric Strid, Portland, OR (US); Peter Hanaway, Portland, OR (US); K. Reed Gleason, Portland, OR (US); Koby L. Duckworth, Newberg, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 14/592,749

(22) Filed: Jan. 8, 2015

(65) Prior Publication Data
US 2015/0114925 A1     Apr. 30, 2015

Related U.S. Application Data

(63) Continuation of application No. 13/287,794, filed on Nov. 2, 2011, now Pat. No. 8,970,240.

(60) Provisional application No. 61/410,242, filed on Nov. 4, 2010.

(51) Int. Cl.
*G01R 1/067* (2006.01)
*H01L 21/48* (2006.01)

(52) U.S. Cl.
CPC ........ *H01L 21/4857* (2013.01); *H01L 21/4825* (2013.01); *H01L 21/4828* (2013.01); *H01L 21/4842* (2013.01); *H01L 21/4853* (2013.01)

(58) Field of Classification Search
CPC .......... G01R 1/07378; G01R 1/06733; G01R 1/06738; G01R 1/07342; G01R 1/0735; G01R 31/2889; G01R 3/00; G01R 31/02; H05K 1/11; H05K 2201/0379; H05K 2201/10378; H05K 3/4046; H05K 3/40; H01R 9/09
USPC .............. 324/754, 755; 439/65, 66, 591, 862; 29/593, 837, 840, 850
See application file for complete search history.

(56) References Cited

U.S. PATENT DOCUMENTS 4,502,747 A   3/1985   Bright et al.
4,793,814 A   12/1988  Zifcak et al.

(Continued)

FOREIGN PATENT DOCUMENTS

TW        I285741      8/2007

OTHER PUBLICATIONS

English-language abstract of Taiwan Patent No. I285741.

*Primary Examiner* — Arleen M Vazquez
*Assistant Examiner* — Neel Shah
(74) *Attorney, Agent, or Firm* — Dascenzo Intellectual Property Law, P.C.

(57) ABSTRACT

Resilient electrical interposers that may be utilized to form a plurality of electrical connections between a first device and a second device, as well as systems that may utilize the resilient electrical interposers and methods of use and/or fabrication thereof. The resilient electrical interposers may include a resilient dielectric body with a plurality of electrical conduits contained therein. The plurality of electrical conduits may be configured to provide a plurality of electrical connections between a first surface of the electrical interposer and/or the resilient dielectric body and a second, opposed, surface of the electrical interposer and/or the resilient dielectric body. The systems and methods disclosed herein may provide for improved vertical compliance, improved contact force control, and/or improved dimensional stability of the resilient electrical interposers.

23 Claims, 7 Drawing Sheets

(56) References Cited

U.S. PATENT DOCUMENTS

| | | |
|---|---|---|
| 5,101,453 A | 3/1992 | Rumbaugh |
| 5,531,022 A * | 7/1996 | Beaman et al. ............... 29/850 |
| 5,800,184 A * | 9/1998 | Lopergolo et al. ............. 439/66 |
| 5,828,226 A | 10/1998 | Higgins et al. |
| 5,914,613 A | 6/1999 | Gleason et al. |
| 6,071,009 A | 6/2000 | Clyne |
| 6,256,882 B1 | 7/2001 | Gleason et al. |
| 6,264,476 B1 | 7/2001 | Li et al. |
| 6,442,039 B1 | 8/2002 | Schreiber |
| 7,026,833 B2 | 4/2006 | Rincon et al. |
| 7,190,181 B2 | 3/2007 | Peters et al. |
| 7,368,925 B2 | 5/2008 | Navratil et al. |
| 7,368,927 B2 | 5/2008 | Smith et al. |
| 7,573,139 B2 | 8/2009 | Gerber et al. |
| 7,862,391 B2 | 1/2011 | Johnston et al. |
| 7,888,957 B2 | 2/2011 | Smith et al. |
| 8,405,229 B2 | 3/2013 | Antesberger et al. |
| 8,638,113 B2 | 1/2014 | Crafts et al. |
| 2006/0001179 A1 | 1/2006 | Fukase et al. |
| 2006/0170435 A1 | 8/2006 | Granicher et al. |
| 2006/0238207 A1 * | 10/2006 | Egitto et al. ............... 324/754 |
| 2007/0057685 A1 | 3/2007 | Garabedian et al. |
| 2008/0246138 A1 | 10/2008 | Gerber et al. |
| 2010/0127725 A1 | 5/2010 | Smith |
| 2012/0086004 A1 | 4/2012 | Fang et al. |

* cited by examiner

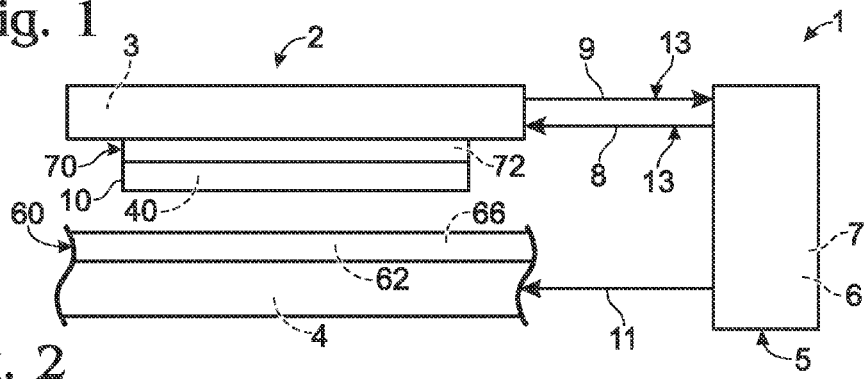
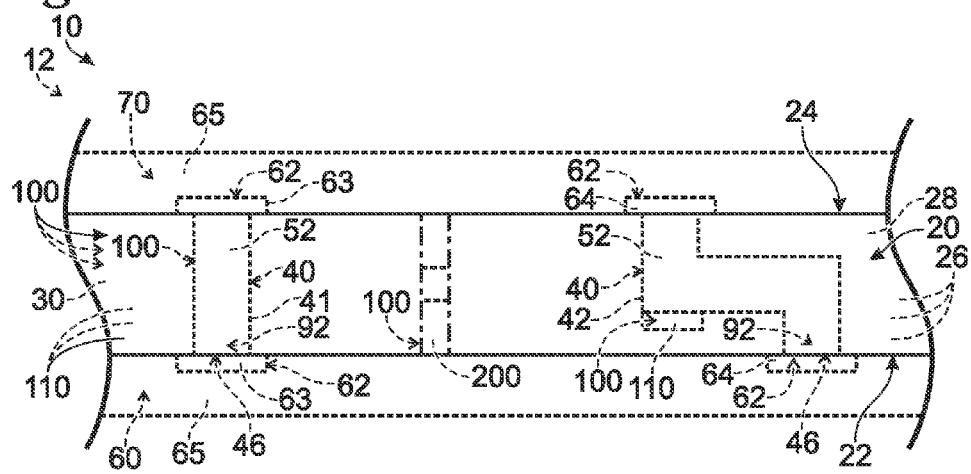
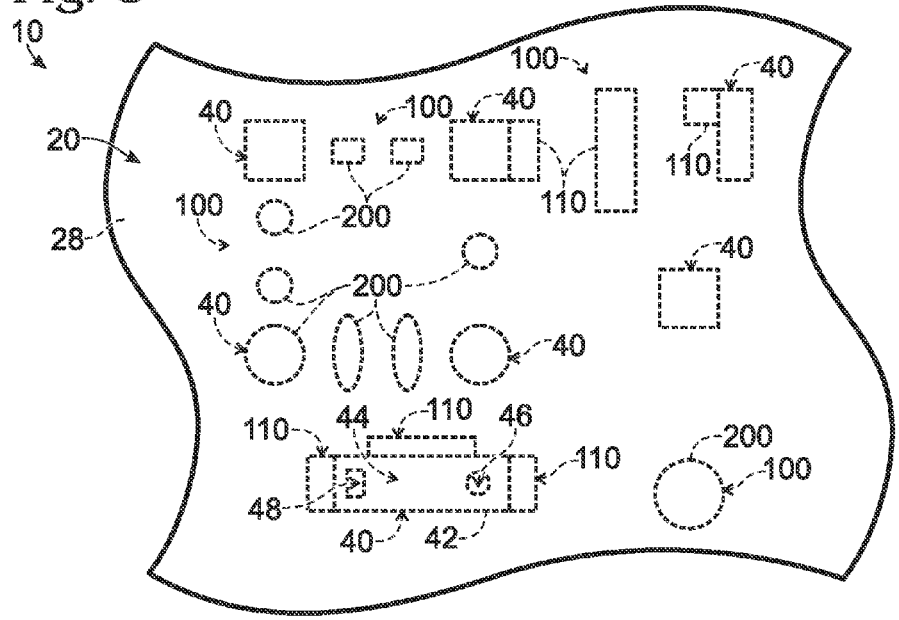

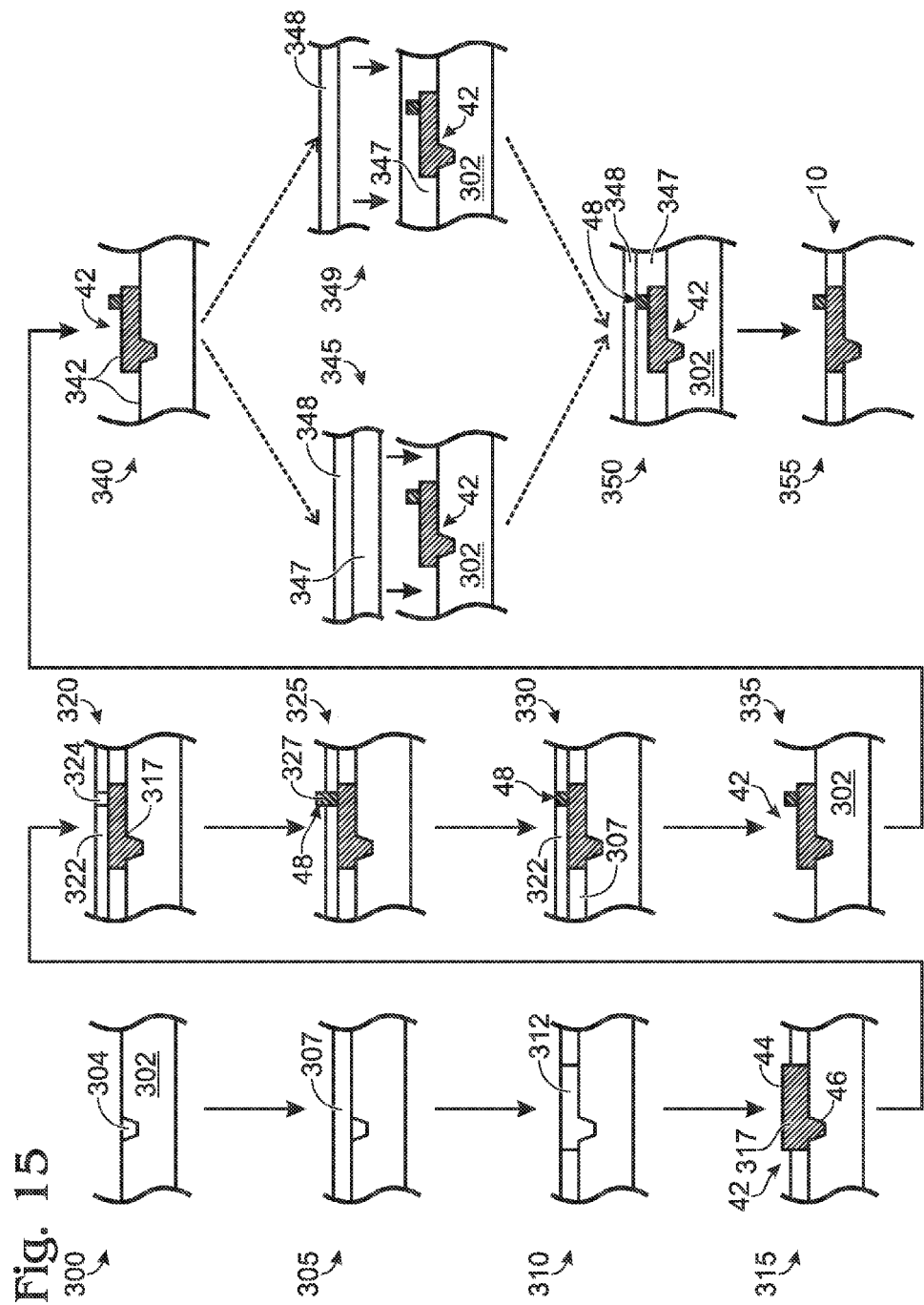

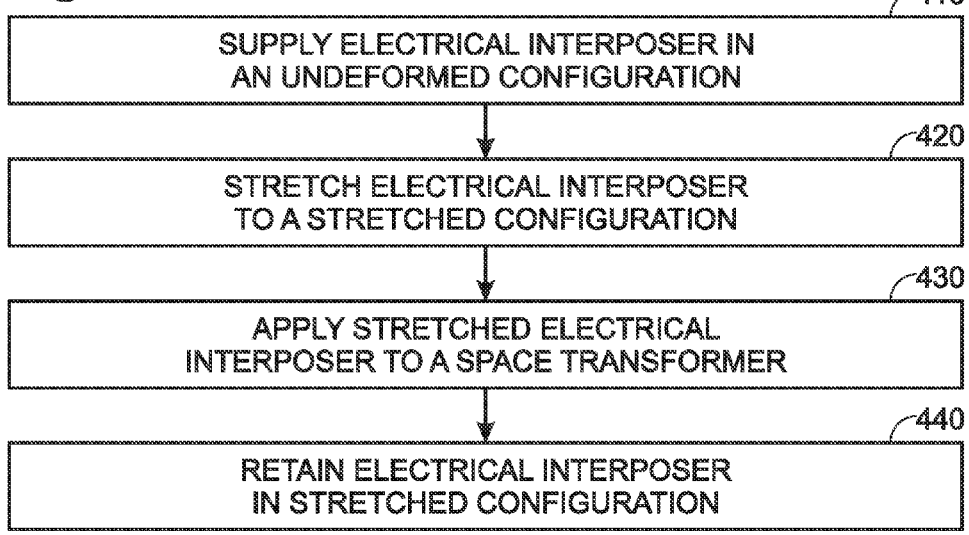
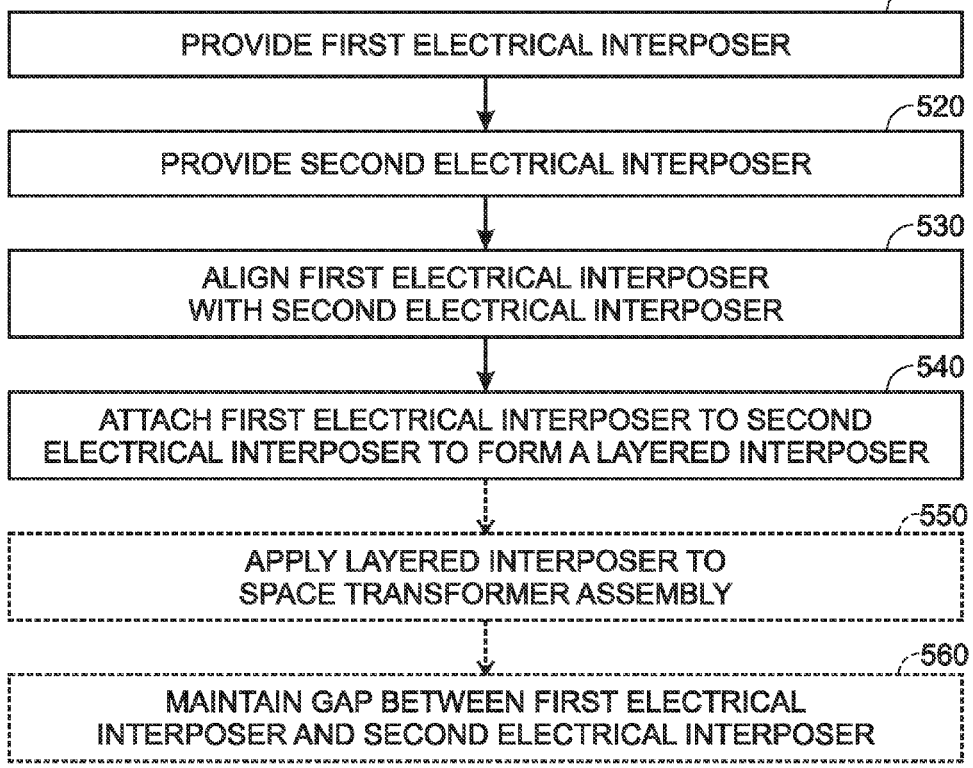

RESILIENT ELECTRICAL INTERPOSERS, SYSTEMS THAT INCLUDE THE INTERPOSERS, AND METHODS FOR USING AND FORMING THE SAME

RELATED APPLICATIONS

This application is a continuation of U.S. patent application Ser. No. 13/287,794, filed on Nov. 2, 2011, and which claims priority to U.S. Provisional Patent Application Ser. No. 61/410,242, which was filed on Nov. 4, 2010. The entire disclosures of the above-identified patent applications are hereby incorporated by reference.

FIELD OF THE DISCLOSURE

The present application is directed to improved resilient electrical interposers, systems that include the resilient electrical interposers, and methods of utilizing and/or fabricating the resilient electrical interposers.

BACKGROUND OF THE DISCLOSURE

Electrical interposers are devices that may be utilized to form one or more electrical connections between a first device and a second device. As used herein, electrical interposers also may be referred to as interposers, and an electrical connection formed by an interposer may be referred to as an electrical interface. The interposers may include any shape that is suitable for forming the electrical interface and may form any suitable number of electrical connections.

Interposers may be utilized in a wide variety of applications where an electrical interface between the first device and the second device is desired. As an illustrative, non-exclusive example, the interposer may be utilized to form a temporary electrical interface between the first device and the second device. As another illustrative, non-exclusive example, the interposer may be utilized to form a permanent, or at least substantially permanent, electrical interface between the first device and the second device.

The construction, specifications, and/or dimensions of the interposer may vary, such as depending upon the particular application for and/or use of the interposer. As an illustrative, non-exclusive example, the interposer may be utilized to form an electrical connection between a probe head that forms a portion of a test system and a device under test (DUT), such as an integrated circuit device and/or chip. As another illustrative, non-exclusive example, the interposer may be utilized between adjacent components, tiers, or other layers of a stacked, or 3-D, integrated circuit device and/or chip.

As the dimensions of the individual components that comprise integrated circuit devices and/or the dimensions of the chip itself continue to decrease, precise control of the dimensional stability of the interposer and/or the contact forces between the interposer and the device under test become increasingly important. Similarly, as integrated circuit devices become increasingly complicated, such as through the inclusion of many and/or more complex individual layers of circuitry therein, an ability of the interposer to provide for increased height variation among a plurality of contact pads that may be present on the surface of the device under test, which also may be referred to herein as a vertical compliance of the interposer, may become increasingly important. Thus, there exists a need for electrical interposers that may provide improved vertical compliance, contact force control, and/or dimensional stability.

SUMMARY OF THE DISCLOSURE

Electrical interposers that may be utilized to form a plurality of electrical connections between a first device and a second device, as well as systems that may utilize the electrical interposers and methods of use and/or fabrication thereof. The electrical interposers may include a resilient dielectric body with a plurality of electrical conduits contained therein. The plurality of electrical conduits may be configured to provide a plurality of electrical connections between a first surface of the electrical interposer and/or the resilient dielectric body and a second, opposed, surface of the electrical interposer and/or the resilient dielectric body. The interposers, systems, and methods disclosed herein may provide for improved vertical compliance, improved contact force control, and/or improved dimensional stability of the electrical interposers, such as compared to conventional interposers and/or interposers having the same or comparable construction but without the compliance modifying structure described herein.

In some embodiments, the electrical interposer may include a compliance modifying structure that is configured to change a restoring force that may be applied to the plurality of electrical conduits by the resilient dielectric body, such as to change the vertical compliance of the electrical interposer and/or the contact force between the plurality of electrical conduits and the first device and/or the second device. In some embodiments, the compliance modifying structure may be associated with the resilient dielectric body. In some embodiments, the compliance modifying structure may be associated with the plurality of electrical conduits. In some embodiments, the compliance modifying structure may include a plurality of compliance modifying regions within the resilient dielectric body. In some embodiments, the compliance modifying structure may include a structure that forms a portion of and/or extends from the plurality of electrical conduits. In some embodiments, the electrical interposer may include a plurality of expansion pockets and/or a dimensional stability layer that is configured to increase the dimensional stability of the resilient electrical interposer when compressed between the first device and the second device and/or subject to thermal cycling.

BRIEF DESCRIPTION OF THE DRAWINGS

FIG. 1 is a schematic representation of illustrative, non-exclusive examples of a test system that is configured to electrically test a device under test and that may include an electrical interposer according to the present disclosure.

FIG. 2 is a schematic representation of illustrative, non-exclusive examples of an electrical interposer according to the present disclosure.

FIG. 3 is a top view of a schematic representation of illustrative, non-exclusive examples of an electrical interposer according to the present disclosure that includes a plurality of compliance modifying structures.

FIG. 15 is a process flow depicting methods of manufacturing the electrical interposers according to the present disclosure.

FIG. 16 is a flowchart depicting methods according to the present disclosure of improving a dimensional stability of an electrical interposer by stretching the electrical interposer.

FIG. 17 is a flowchart depicting methods according to the present disclosure of increasing a vertical compliance of a device under test contacting assembly by stacking a plurality of electrical interposers.

DETAILED DESCRIPTION AND BEST MODE OF THE DISCLOSURE

Figure 4:
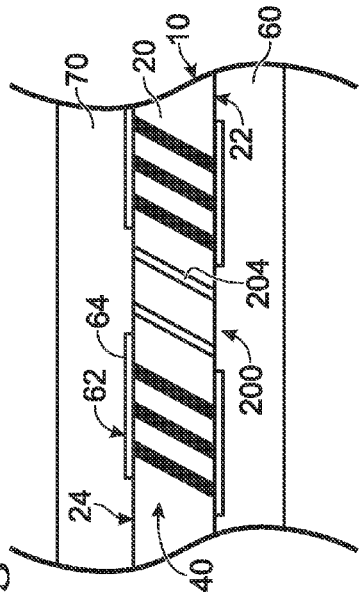
FIG. 4 is a less schematic, but still illustrative, non-exclusive example of an electrical interposer according to the present disclosure that includes a plurality of expansion pockets.

FIG. 1 is a schematic representation of illustrative, non-exclusive examples of a test system 1 that is configured to electrically test a first device 60, such as a device under test 66, and which may include an electrical interposer 10 according to the present disclosure. In the illustrative, non-exclusive example of FIG. 1, electrical interposer 10 also may be referred to herein as probe head 10. The test system of FIG. 1 includes a probe head assembly 2 that may include a load board 3, which is operatively attached to and/or in electrical communication with a second device 70, such as a space transformer 72. Electrical interposer 10 may be operatively attached to and/or in electrical communication with second device 70. A chuck 4 may hold, retain, and/or otherwise locate first device 60.

The test system further may include and/or be in electrical communication with a control system 5 that is configured to control the operation of test system 1. Control system 5 may be configured to control a relative orientation of probe head assembly 2 with respect to first device 60. As an illustrative, non-exclusive example, electrical interposer 10 may include a plurality of electrical conduits 40 that are in electrical communication with probe head assembly 2 and/or control system 5. Control system 5 may be configured to control the relative orientation of the probe head assembly with respect to first device 60, such as through the use of control signal 11, to form a plurality of electrical connections between the plurality of electrical conduits and a plurality of contact pads 62 that are located on first device 60, such as on or proximate a surface thereof.

Control system 5 further may include a signal generator 6 that is configured to generate, or produce, a test signal 8, which may be supplied through a signal conduit 13 to probe head assembly 2 and/or electrical conduits 40 before being provided to first device 60. Upon receipt of test signal 8, first device 60 may produce, or generate, resultant signal 9, which may be provided through electrical conduits 40, probe head assembly 2, and/or signal conduit 13 to a signal analyzer 7. Signal analyzer 7 may be configured to receive and/or analyze the resultant signal to evaluate one or more electrical characteristics of first device 60. Illustrative, non-exclusive examples of test systems 1 that may include and/or utilize electrical interposers 10 according to the present disclosure are disclosed in U.S. Provisional Patent Application Ser. Nos. 61/410,242, 61/446,379, and 61/484,116 and in U.S. Pat. Nos. 5,101,453, 5,914,613, 6,071,009, 6,256,882, 7,190,181, 7,368,925, and 7,862,391, the complete disclosures of which are hereby incorporated by reference.

While shown in FIG. 1 in the context of test system 1 and/or probe head assembly 2, electrical interposers 10 according to the present disclosure may be utilized in, and/or may form a portion of, any suitable structure. This may include the use of electrical interposers 10 to form a plurality of electrical connections between a first device 60 and a second device 70 in a variety of different systems and/or configurations. Illustrative, non-exclusive examples of first device 60 and/or second device 70 according to the present disclosure may include any suitable space transformer 72, electronic device, device under test (DUT) 66, integrated circuit, electrical interposer, socket, tier of a three-dimensional integrated circuit, probe head, portion of a probe head, test system, and/or portion of a test system.

As an illustrative, non-exclusive example, electrical interposer 10 may include, form a portion of, and/or be a membrane that is configured to extend across all or a portion of a contact surface of a space transformer and to form a plurality of electrical connections between the space transformer and a device under test. As another illustrative, non-exclusive example, electrical interposer 10 may include, form a portion of, and/or be a coupon that is configured to be adhered to a space transformer and to form a plurality of electrical connections between the space transformer and a device under test.

As yet another illustrative, non-exclusive example, electrical interposer 10 may include, form a portion of, and/or be a coupon that is configured to form an electrical connection between a first electronic device, such as a first tier of a three-dimensional integrated circuit (3-D IC), and a second electronic device, such as a second tier of the 3-D IC. As another illustrative, non-exclusive example, electrical interposer 10 may include, form a portion of, and/or be a coupon that is configured to form an electrical connection between a first electronic device, such as an integrated circuit, and a socket. As yet another illustrative, non-exclusive example, electrical interposer 10 may include, form a portion of, and/or be a coupon that is configured to form an electrical connection between a first space transformer and a second space transformer.

Electrical interposers 10 may be maintained in electrical communication with the first device and/or the second device using any suitable system, method, and/or mechanism. As an illustrative, non-exclusive example, the coupon may be adhered to the first device and/or the second device. As another illustrative, non-exclusive example, the coupon may be pressed into electrical communication with at least one of the first device and the second device.

When the coupon is adhered to the first device and/or the second device, any suitable adhesive and/or adhesive configuration may be utilized. As an illustrative, non-exclusive example, the adhesive may be located around a periphery of the electrical interposer, the first device, and/or the second device such that the adhesive does not contact the plurality of electrical contacts and/or contact pads thereof. As another illustrative, non-exclusive example, the adhesive may be patterned such that it does not contact the plurality of electrical contacts and/or contact pads. As another illustrative, non-exclusive example, the adhesive may include a dilute adhesive with a low solids content, such as less than 1% by weight, and the adhesive may cover an entire surface of the electrical interposer but provide for conduction of electric current therethrough.

As discussed in more detail herein, the adhesive, when utilized, may be configured to be permanent and/or may be configured to be removed to provide for separation of electrical interposer 10 from first device 60 and/or second device 70 without damage to electrical interposer 10, first device 60, and/or second device 70. In this regard, and when so adhered, it is within the scope of the present disclosure, although not required to all embodiments, that a suitable adhesive may be used to permit selective removal of the coupon/interposer without damage to the first and second devices, and optionally without damage to the coupon/interposer and the first and second devices.

Additional illustrative, non-exclusive examples of electrical interposers 10 according to the present disclosure and/or uses thereof are discussed in more detail herein. Illustrative, non-exclusive examples of membranes and/or coupons that may be utilized with the systems and methods according to the present disclosure are disclosed in U.S. Patent Application Publication No. 2010/0127725 and U.S. Pat. Nos. 5,914, 613, 7,368,927, and 7,888,957 the complete disclosures of which are hereby incorporated by reference.

FIG. 2 is a schematic representation of illustrative, non-exclusive examples of electrical interposer 10 according to the present disclosure. The electrical interposer of FIG. 2 includes a resilient dielectric body 20 that is associated with a plurality of electrical conduits 40. Electrical conduits 40 may be configured to provide a plurality of electrical connections between a first device 60 that is proximal to a first surface 22 of the electrical interposer and a second device 70 that is proximal to a second surface 24 of the electrical interposer. As used herein, the phrase "associated with" means that a given structure includes, is proximal to, is in physical communication with, is in electrical communication with, surrounds, encapsulates, defines, and/or contains another given structure. As an illustrative, non-exclusive example, and when electrical conduits 40 include metallic electrical conduits, resilient dielectric body 20 may surround and/or encapsulate at least a portion of each of the metallic electrical conduits.

Electrical interposer 10 may be configured to be compressed between first device 60 and second device 70 to provide for formation of the plurality of electrical connections, such as to provide for the formation of a plurality of electrical connections between electrical conduits 40 and contact pads 62. When the electrical interposer is compressed between the first device and the second device, the plurality of electrical conduits 40 may be configured to deflect from an undeflected configuration to a deflected configuration due to the application of a contact force by at least one of the first device and the second device. When the plurality of electrical conduits is in the deflected configuration, resilient dielectric body 20 may be deformed by the deflection and may be configured to provide a restoring force that may direct and/or otherwise urge the plurality of electrical conduits from the deflected configuration to the undeflected configuration upon removal of the contact force.

As shown in FIG. 2, electrical interposer 10 may be associated with one or more compliance modifying structures 100 that may be configured to control, modify, and/or change a compliance, or deformational response to externally applied forces, of electrical interposer 10 and/or one or more components thereof. As illustrative, non-exclusive examples, compliance modifying structures 100 may increase a dimensional stability of the electrical interposer when compressed between the first device and the second device, may modify (i.e., increase or decrease) a mechanical response of the electrical interposer when compressed between the first device and the second device, may increase or decrease the restoring force that is applied to the plurality of electrical conduits by the resilient dielectric body, may increase or decrease an induced motion of the plurality of electrical conduits upon application of a given contact force magnitude, and/or may increase a relative and/or absolute magnitude of a distance that electrical interposer 10 may be compressed without damage to the electrical interposer and/or components thereof, such as electrical conduits 40 and/or resilient dielectric body 20.

As shown in FIG. 2, compliance modifying structures 100 may be associated with any suitable portion of electrical interposer 10. As an illustrative, non-exclusive example, the compliance modifying structures may be associated with resilient dielectric body 20 and may be referred to herein as compliance modifying regions 110 and/or expansion pockets 200. Additional illustrative, non-exclusive examples of compliance modifying regions 110 and/or expansion pockets 200 are discussed in more detail herein. As another illustrative, non-exclusive example, the compliance modifying structures may be associated with electrical conduits 40. Illustrative, non-exclusive examples of compliance modifying structures that are associated with electrical conduits 40 are discussed in more detail herein.

Resilient dielectric body 20 may include and/or be associated with any suitable structure and/or materials of construction that are configured to provide a desired compliance and/or a desired magnitude of the restoring force that may be applied to electrical conduits 40 by the resilient dielectric body. It is within the scope of the present disclosure that resilient dielectric body 20 may include and/or be a monolithic dielectric body. Additionally or alternatively, it is also within the scope of the present disclosure that resilient dielectric body 20 may include and/or be a composite dielectric body.

When resilient dielectric body 20 includes the composite dielectric body, it is within the scope of the present disclosure that the resilient dielectric body may include any suitable composite structure. As an illustrative, non-exclusive example, and as discussed in more detail herein, the resilient dielectric body may include a plurality of layers 26, which also may be referred to herein as resilient layers 26. Illustrative, non-exclusive examples of layers 26 according to the present disclosure include any suitable elastomeric layer 28 and/or any suitable dimensional stability layer 30. As discussed in more detail herein, elastomeric layers 28 may include any suitable layer and/or material that is configured to provide electrical interposer 10 with a desired level of resilience, compliance, and/or elastic deformation upon application of an external force thereto. In addition, and as also discussed in more detail herein, dimensional stability layers 30 may include any suitable layer and/or material that is configured to provide electrical interposer 10 with a desired level of dimensional stability.

Resilient dielectric body 20, and/or one or more layers 26 thereof, may include and/or be constructed from any suitable material and/or materials. Illustrative, non-exclusive examples of materials that may be included in resilient dielectric body 20 include any suitable polymer, elastomer, silicone, foam, closed cell foam, polyimide, resin, epoxy, urethane, polystyrene, polyethylene, polyamide, ABS, polycarbonate, fluoropolymer, and/or combinations thereof.

Electrical conduits 40 may include any suitable structure that is configured to provide the electrical connection between first surface 22 and second surface 24 and/or between first device 60 and second device 70 associated therewith. As an illustrative, non-exclusive example, and as discussed in more detail herein, electrical conduits 40 may include one or more probe tips 46 that are configured to form an electrical connection between electrical conduits 40 and contact pads 62 of first device 60 and/or second device 70. As another illustrative, non-exclusive example, and as also discussed in more detail herein, electrical conduits 40 may include and/or be in electrical communication with one or more contact structures 92 that are configured to decrease an abrasion of contact pads 62 when electrical conduits 40 form the electrical connection therewith.

Electrical conduits 40 additionally or alternatively may include any suitable structure that is configured to provide for a desired level of compliance within electrical interposer 10, and/or compression thereof. As an illustrative, non-exclusive example, contact pads 62 may include opposed, or at least substantially opposed, contact pads 63, and electrical conduits 40 may include linear, or at least substantially linear, electrical conduits 41.

A longitudinal axis of linear electrical conduits 41 may be perpendicular, or at least substantially perpendicular, to first surface 22 and/or second surface 24, as shown in FIG. 2. Additionally or alternatively, the longitudinal axis of linear electrical conduits 41 may be at an angle with respect to first surface 22 and/or second surface 24.

When the longitudinal axis is perpendicular to first surface 22 and/or second surface 24, linear electrical conduits 41 may include electrical conduits that may be configured to bend, flex, compress, and/or otherwise deform to provide for compression of electrical interposer 10. When the longitudinal axis is at an angle with respect to first surface 22 and/or second surface 24, the linear electrical conduits may include flexible electrical conduits, or rigid, or at least substantially rigid, electrical conduits.

As another illustrative, non-exclusive example, contact pads 62 may include offset contact pads 64 and electrical conduits 40 may include an offset structure that is configured to provide the electrical connection between respective offset contact pads 64 of first device 60 and second device 70. As an illustrative, non-exclusive example, and as discussed in more detail herein, the offset structure may include linear electrical conduits 41, wherein the longitudinal axis of the linear electrical conduits extends at an angle to first surface 22 and/or second surface 24 and between offset contact pads 64. As another illustrative, non-exclusive example, and as also discussed in more detail herein, the electrical conduits may include rocking beam electrical conduits 42.

Electrical conduits 40 and/or probe tips 46 thereof may be configured to scrub and/or otherwise abrade a surface oxide film that may be present on contact pads 62 during compression of electrical interposer 10 between first device 60 and second device 70. Illustrative, non-exclusive examples of electrical conduits 40 and/or scrubbing action thereof that may be utilized with the systems and/or methods according to the present disclosure are disclosed in U.S. Provisional Patent Application Ser. No. 61/410,242, and in U.S. Pat. Nos. 5,914, 613, 6,256,882, and 7,862,391, the disclosures of which are hereby incorporated by reference.

This scrubbing may decrease a contact resistance and/or increase an electrical conductivity between electrical conduits 40 and their respective contact pads 62. As an illustrative, non-exclusive example, and when contact pads 62 include opposed contact pads 63, a shape of probe tip 46 and/or a deformation of electrical conduit 42 during compression of electrical interposer 10 may produce a relative motion of the probe tip with respect to the opposed contact pads to produce the scrubbing. As another illustrative, non-exclusive example, and when contact pads 62 include offset contact pads 64, a torque that is placed on electrical conduits 40 during compression of electrical interposer 10 may produce the relative motion of probe tip 46 with respect to the offset contact pads to produce the scrubbing.

Electrical conduits 40 further may include an optional anchor structure 52, which also may be referred to herein as a retention structure 52. Anchor structure 52, when present, may be configured to affix, hold, and/or otherwise retain the electrical conduits within electrical interposer 10 and/or resilient dielectric body 20 thereof. It is within the scope of the present disclosure that electrical conduits 40 may be configured to be permanently retained within the electrical interposer. However, it is also within the scope of the present disclosure that electrical conduits 40 may be configured to be removed from the electrical interposer without damage to the electrical interposer, the resilient dielectric body, and/or the electrical conduits.

As an illustrative, non-exclusive example, one or more damaged electrical conduits may be removed from the electrical interposer and replaced with one or more different electrical conduits that are not damaged to repair the electrical interposer. As another illustrative, non-exclusive example, one or more electrical conduits may be removed from the electrical interposer for repair and/or cleaning before being reinserted into the electrical interposer. As yet another illustrative, non-exclusive example, one or more electrical conduits that have separated from the electrical interposer, such as during use of the electrical interposer, may be reinserted into the electrical interposer. As a further variant, one or more electrical conduits that have been lost or separated from the electrical interposer may be replaced with one or more electrical conduits having the same or different sizes or configurations.

As discussed in more detail herein, electrical interposers 10 may include any suitable structure and/or be utilized with any suitable method that may increase the dimensional stability of the electrical interposer when it is compressed between first device 60 and second device 70 and/or when the electrical interposer is subjected to thermal cycling. As used herein, the term "dimensional stability" may refer to the ability of electrical interposers 10 to retain and/or otherwise maintain a fixed, or at least substantially fixed, orientation of electrical conduits 40 with respect to contact pads 62 when the electrical interposer is compressed between first device 60 and second device 70 and/or when the electrical interposer, together with first device 60 and second device 70, is subjected to thermal cycling. As used herein, "thermal cycling" refers to repeated heating and cooling such as during periods of use and non-use.

As an illustrative, non-exclusive example, the systems and methods disclosed herein may be configured to decrease a variation in the location of electrical conduits 40 when the electrical interposer is compressed. As another illustrative, non-exclusive example, an increase in the dimensional stability of the electrical interposer may produce and/or be measured by a corresponding decrease in a planar expansion, or expansion in the plane of first surface 22 and/or second surface 24, when the electrical interposer is compressed. As yet another illustrative, non-exclusive example, increased dimensional stability may provide for maintaining the plurality of electrical connections between electrical conduits 40 and the associated contact pads 62 of first device 60 and/or second device 70 over a desired range of temperatures despite differences in a coefficient of thermal expansion among electrical interposer 10, first device 60, and/or second device 70.

Illustrative, non-exclusive examples of structures that may be utilized to increase the dimensional stability of electrical interposer 10 include dimensional stability layers 30 and/or expansion pockets 200 and are discussed in more detail herein. As shown in dashed lines in FIG. 2, expansion pockets 200 may be contained within resilient dielectric body 20. However, and as shown in dash-dot lines in FIG. 2, expansion pockets 200 also may extend from and/or between first surface 22 and second surface 24.

Illustrative, non-exclusive examples of methods that may increase the dimensional stability of the electrical interposer are discussed in more detail herein and may include thermal cycling of the interposer and/or stretching the electrical interposer from a first, or undeformed, size to a second, or deformed, size that is larger than the first size in the plane of first surface 22 and/or second surface 24 prior to compression of the electrical interposer between first device 60 and second device 70. Stretching the electrical interposer also may provide for a smaller difference in an effective coefficient of thermal expansion between the materials that comprise electrical interposer 10 and the materials that comprise first device 60 and/or second device 70 due to the internal stresses that may be produced within electrical interposer 10 by the stretching.

When electrical interposer 10 is not providing the plurality of electrical connections between first device 60 and second device 70, first device 60 and/or second device 70 may include and/or be a cover 65, which also may be referred to herein as a handler 65, that may be configured to cover, encase, and/or otherwise protect electrical interposer 10, electrical conduits 40, and/or probe tips 46 thereof from damage. Cover 65 may include a plurality of recesses that may be located to correspond to a location of the plurality of electrical conduits and may accept probe tips 46 of electrical conduits 40.

FIGS. 3-14 provide additional, less schematic but still illustrative, non-exclusive examples of electrical interposers 10 according to the present disclosure and/or systems, components, features, structures, and/or configurations that may be included in and/or utilized with electrical interposers 10 according to the present disclosure. Similar structures, including those of FIGS. 1-2, are denoted with similar numbers and may not be discussed in detail herein with reference to each individual Figure. It is within the scope of the present disclosure that any of the systems, components, features, structures, and/or configurations disclosed herein may be utilized with any electrical interposer 10 according to the present disclosure. In addition, although several of the Figures illustrate electrical conduits 40 as including linear electrical conduits 41 and rocking beam electrical conduits 42, any suitable electrical conduit 40 and/or any suitable combination thereof may be utilized in any electrical interposer 10 according to the present disclosure. As an illustrative, non-exclusive example, electrical interposer 10 may include rocking beam electrical conduit 42 but not linear electrical conduit 41.

FIG. 3 provides a top view of a schematic representation of illustrative, non-exclusive examples of an electrical interposer 10 according to the present disclosure that includes a plurality of compliance modifying structures 100 in the form of a plurality of compliance modifying regions 110 and/or expansion pockets 200 that are present in and/or associated with resilient dielectric body 20. As shown in FIG. 3, compliance modifying regions 110 may be associated with, be in mechanical communication with, separate at least a portion of resilient dielectric body 20 from, and/or be adjacent to electrical conduits 40. This may include compliance modifying regions 110 that may be directly adjacent to and/or touching electrical conduits 40, as well as compliance modifying regions that may be spaced apart from electrical conduits 40.

Additionally or alternatively, compliance modifying regions 110 may be associated with, proximal to, and/or in mechanical communication with any suitable portion of electrical conduits 40. As an illustrative, non-exclusive example, electrical conduits 40 may include rocking beam electrical conduits 42 that may include a beam structure 44, a probe tip 46, and a beam contact 48, and compliance modifying regions 110 may be associated with the beam structure, the probe tip, and/or the beam contact.

As also shown in FIG. 3, expansion pockets 200 may be present at any suitable location within electrical interposer 10. As an illustrative, non-exclusive example, electrical interposer 10 may include one or more expansion pockets 200 between and/or separating adjacent electrical conduits 40. As another illustrative, non-exclusive example, electrical interposer 10 may include one or more expansion pockets 200 that are separated from, isolated from, and/or not located between electrical conduits 40.

As illustrated schematically in FIG. 3, compliance modifying structures 100, compliance modifying regions 110, and/or expansion pockets 200, may include any suitable shape, length, cross-sectional shape, orientation, and/or extent within electrical interposer 10. As illustrative, non-exclusive examples, compliance modifying regions 110 and/or expansion pockets 200 may include circular, arcuate, ellipsoidal, elongate, and/or rectilinear cross-sectional shapes. As additional illustrative, non-exclusive examples, compliance modifying regions 110 and/or expansion pockets 200 may be contained between the first surface and the second surface of the electrical interposer, may extend from at least one of the first surface and the second surface, and/or may extend between the first surface and the second surface (as shown in FIG. 2).

As also shown in FIG. 3, compliance modifying regions 110 and/or expansion pockets 200 may not be uniformly distributed within resilient dielectric body 20. As illustrative, non-exclusive examples, this may include compliance modifying regions and/or expansion pockets that are not uniformly distributed in a direction that is parallel to at least one of the first surface and the second surface of the resilient dielectric body and/or are systematically distributed within the resilient dielectric body. However, compliance modifying regions 110 and/or expansion pockets 200 may include and/or be randomly and/or regularly distributed regions and/or domains within the resilient dielectric body.

Compliance modifying structures, including compliance modifying regions 110 and/or expansion pockets 200 thereof, may include any suitable materials of construction that may be configured to modify the restoring force that is applied to electrical conduits 40 by resilient dielectric body 20 and/or to increase the dimensional stability of electrical interposer 10, respectively. As an illustrative, non-exclusive example, the compliance modifying structures may include a different composition, a different chemical composition, a different density, a different viscoelasticity, a different Young's modulus, and/or a different yield strain than that of the resilient dielectric body. Illustrative, non-exclusive examples of compliance modifying regions 110 and/or expansion pockets 200 include any suitable void within resilient dielectric body 20, air pocket within the resilient dielectric body, domain with a different composition than that of the resilient dielectric body, and/or foam domain within the resilient dielectric body.

Figure 5:
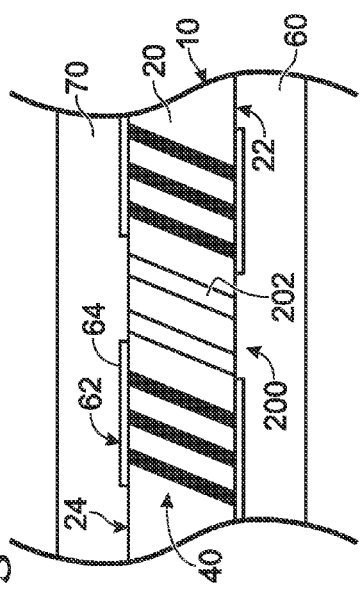
FIG. 5 is another less schematic, but still illustrative, non-exclusive example of expansion pockets.

FIGS. 4-5 provide less schematic but still illustrative, non-exclusive examples of an electrical interposer 10 according to the present disclosure that includes a plurality of expansion pockets 200. As shown in FIGS. 4 and 5, expansion pockets 200 may be located between a plurality of electrical conduits 40, with the plurality of electrical conduits being configured to provide the electrical connection between contact pads 62 that are associated with first device 60 and contact pads 62 that are associated with second device 70.

In FIG. 4, first device 60 and second device 70 are in contact with, but are not compressing, electrical interposer 10, and expansion pockets 200 are in an expanded configuration 202. In contrast, FIG. 5 shows first device 60 and second device 70 compressing electrical interposer 10, with expansion pockets 200 in a contracted, or compressed, configuration 204.

As shown in FIG. 5, expansion pockets 200 are configured to provide for compression of the electrical interposer in a region between the electrical contacts without substantial motion of the plurality of electrical contacts with respect to the contact pads associated with first device 60 and/or second device 70 and/or a substantial change in an overall dimension and/or area of electrical interposer 10 in a plane of first surface 22 and/or second surface 24. Additionally or alternatively, expansion pockets 200 also may change, modify, increase, and/or decrease a mechanical coupling between and/or among adjacent and/or proximal electrical conduits 40, such as by modifying the viscoelastic behavior of the portion of the resilient dielectric body that extends therebetween.

Figure 6:
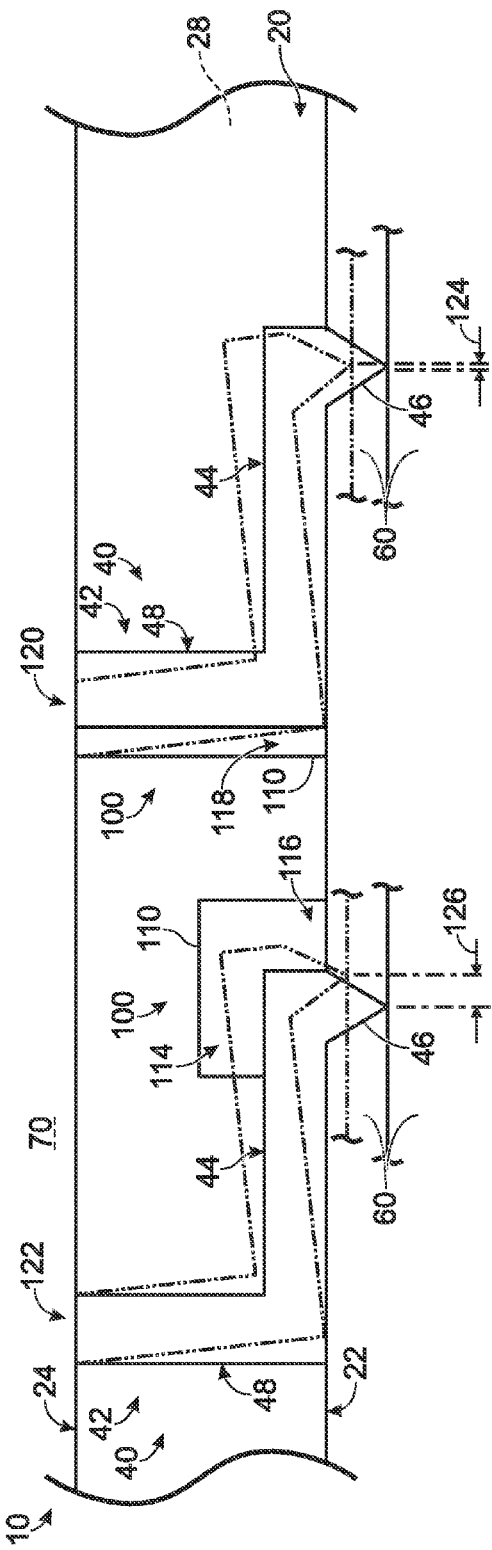
FIG. 6 is a schematic representation of illustrative, non-exclusive examples of an electrical interposer according to the present disclosure that may include a plurality of compliance modifying regions.

FIG. 6 provides a schematic representation of illustrative, non-exclusive examples of an electrical interposer 10 according to the present disclosure that includes a plurality of compliance modifying regions 110. As discussed in more detail herein and as shown in FIG. 6, electrical conduits 40 of electrical interposer 10 may include any suitable shape and/or structure, including rocking beam electrical conduits 42.

Rocking beam electrical conduit 42 may include a plurality of structures, including beam structure 44, probe tip 46, and/or beam contact 48. Probe tip 46 may extend from beam structure 44 in a first direction and may extend past first surface 22. In addition, beam contact 48 may extend from beam structure 44 in a second direction that is generally opposed to the first direction and may extend at least flush with second surface 24. Beam structure 44 may be in mechanical contact with, adhered to, and/or operatively attached to resilient dielectric membrane 20 and may be parallel to, or at least substantially parallel to, first surface 22 and/or second surface 24 when the electrical interposer, and/or the resilient dielectric body thereof, is in the undeformed state (i.e., not compressed between first device 60 and second device 70), as shown in solid lines in FIG. 6.

It is within the scope of the present disclosure that rocking beam electrical conduit 42 may include any suitable material properties, composition, and/or materials of construction. As illustrative, non-exclusive examples, rocking beam electrical conduit 42 and/or beam structure 44, probe tip 46, and/or beam contact 48 thereof, may include and/or be a rigid structure, a substantially rigid structure, a flexible structure, a monolithic structure, and/or a composite structure.

As discussed in more detail herein, electrical interposer 10 may be configured to be compressed between first device 60 and second device 70. When the electrical interposer is compressed, first device 60 and/or second device 70 may apply a contact force to the electrical interposer, such as to resilient dielectric body 20, probe tips 46, and/or beam contacts 48 thereof. This contact force may rotate, deflect, and/or otherwise disturb an orientation of resilient dielectric body 20 and/or rocking beam electrical conduit 42, such as shown in dash-dot-dot lines in FIG. 6, and the electrical interposer may apply an equal and opposite restoring force to first device 60 and second device 70, such as through resilient dielectric body 20, probe tips 46, and/or beam contacts 48 thereof.

Compliance modifying regions 110 may be associated with, proximal to, and/or in mechanical communication with any suitable portion of the rocking beam electrical conduit, including beam structure 44, as shown schematically at 114, probe tip 46, as shown schematically at 116, and/or beam contact 48, as shown schematically at 118. When a compliance modifying region is associated with beam structure 44 and/or probe tip 46, the compliance modifying region 110 may be configured to change, decrease, or increase the restoring force that may be applied to the rocking beam electrical conduit when the rocking beam electrical conduit is deflected due to the application of the contact force thereto.

As an illustrative, non-exclusive example, a compliance modifying region that is associated with the beam structure and/or the probe tip may include a void, an air pocket, and/or another region and/or material with a lower (or nonexistent) Young's modulus than that of resilient dielectric body 20. This may decrease the restoring force that may be applied to the rocking beam electrical conduit by the resilient dielectric body for a given amount of compression of the electrical interposer and/or deflection of the rocking beam electrical conduit, thereby decreasing a contact force between the rocking beam electrical conduit and first device 60 and/or second device 70. Additionally or alternatively, this may increase a distance that the rocking beam electrical conduit may be deflected without damage to electrical interposer 10, thereby increasing the compliance of the electrical interposer.

As another illustrative, non-exclusive example, the compliance modifying region that is associated with the beam structure and/or the probe tip may include a region and/or material with a higher Young's modulus than that of resilient dielectric body 20. This may increase the restoring force that may be applied to the rocking beam electrical conduit by the resilient dielectric material for a given amount of compression of the electrical interposer and/or deflection of the rocking beam electrical conduit, thereby increasing a contact force between the rocking beam electrical conduit and first device 60 and/or second device 70.

When the compliance modifying region 110 is associated with beam contact 48, the compliance modifying region may be configured to change, decrease, or increase the restoring force that may be applied to the rocking beam electrical conduit, as described above. Additionally or alternatively, the compliance modifying region also may be configured to change, decrease, or increase the scrubbing action between probe tip 46 and first device 60 upon compression of electrical interposer 10 between the first device and the second device.

As an illustrative, non-exclusive example, and as shown at 118, a compliance modifying region that is associated with the beam contact may include a void, an air pocket, and/or another region and/or material with a lower (or nonexistent) Young's modulus than that of resilient dielectric body 20. This may increase a degree of freedom and/or a relative motion of beam contact 48 upon compression of the electrical interposer (as shown at 120) when compared to a rocking beam electrical interposer that does not include compliance modifying region 118 (as shown at 122). This increase in the relative motion of beam contact 48 may provide for scrubbing between beam contact 48 and second device 70 and/or may provide for a decrease in the relative motion, or scrubbing, between probe tip 46 and first device 60 (as shown at 124) when compared to a rocking beam electrical interposer that does not include compliance modifying region 118 (as shown at 126).

Figure 7:
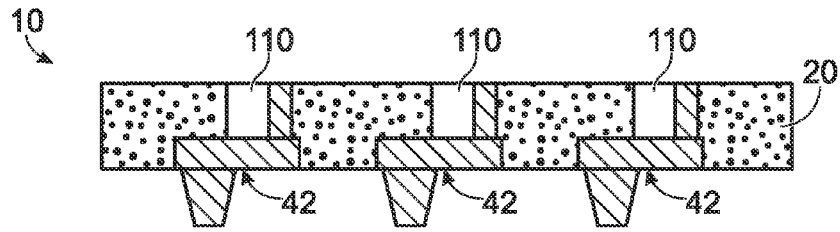
FIG. 7 is a less schematic, but still illustrative, non-exclusive example of an electrical interposer according to the present disclosure that includes a plurality of compliance modifying regions.
Figure 8:
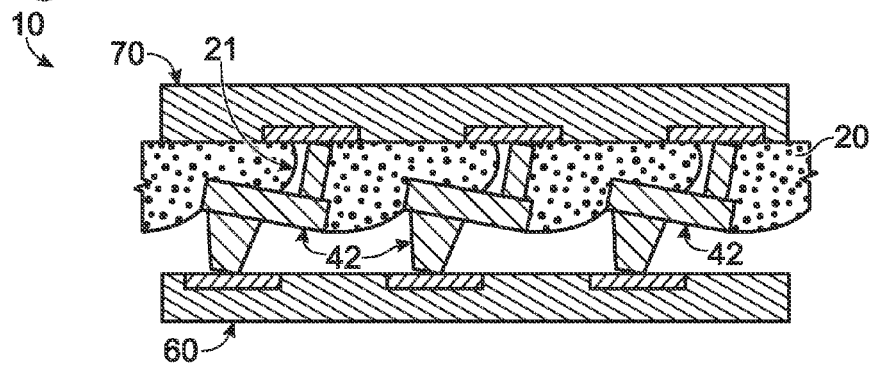
FIG. 8 is another less schematic, but still illustrative, non-exclusive example of an electrical interposer according to the present disclosure that includes a plurality of compliance modifying regions.

FIGS. 7-8 provide less schematic, but still illustrative, non-exclusive, examples of an electrical interposer 10 according to the present disclosure that includes a plurality of compliance modifying regions 110 and a plurality of rocking beam electrical conduits 42. FIG. 7 illustrates the electrical interposer in the undeformed state, while FIG. 8 illustrates the electrical interposer in the deformed state after being compressed between first device 60 and second device 70. As shown at 21 in FIG. 8, the presence of compliance modifying regions 110 within resilient dielectric body 20 may provide deformation modes for resilient dielectric body 20 and/or ranges of motion for rocking beam electrical contact 42 that may not be available to an electrical interposer that includes resilient dielectric body 20 and rocking beam electrical conduits 42 but that does not include compliance modifying regions 110.

Figure 9:
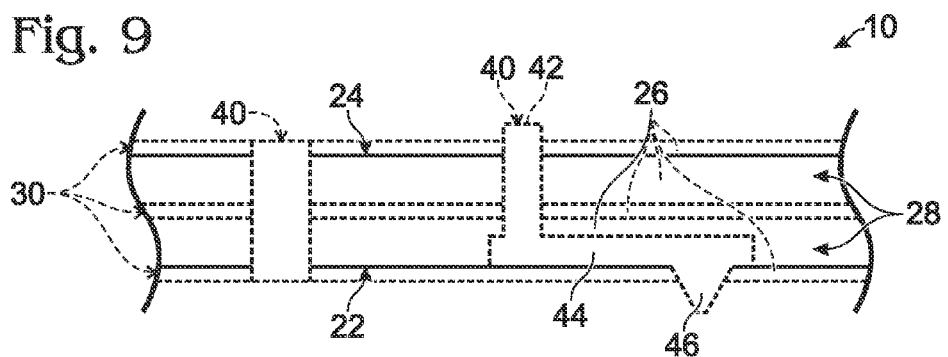
FIG. 9 is a schematic representation of illustrative, non-exclusive examples of an electrical interposer according to the present disclosure that includes a plurality of dielectric layers.

FIG. 9 provides a schematic representation of illustrative, non-exclusive examples of an electrical interposer 10 according to the present disclosure that includes a plurality of planar dielectric layers 26. Planar dielectric layers 26 may include and/or be any suitable material and serve any suitable purpose. As an illustrative, non-exclusive example, the planar dielectric layers may include and/or be one or more elastomeric layers 28 that are configured to provide increased elasticity and/or compliance to the electrical interposer. An illustrative, non-exclusive example of an elastomeric layer includes a silicone layer.

As another illustrative, non-exclusive example, the planar dielectric layers may include and/or be one or more dimensional stability layers 30 that are configured to increase the dimensional stability of the electrical interposer and/or maintain an at least substantially fixed relative orientation of the plurality of electrical conduits 40 within a plane of the resilient dielectric body when electrical interposer 10 is compressed and/or experiences thermal cycling. An illustrative, non-exclusive example of a dimensional stability layer includes a polyimide layer.

The dimensional stability layer may be present at any suitable location within electrical interposer 10 and/or resilient dielectric body 20 thereof. As illustrative, non-exclusive examples, dimensional stability layer 30 may be present on and/or form first surface 22 of the resilient dielectric body and/or second surface 24 of the resilient dielectric body. As another illustrative, non-exclusive example, the dimensional stability layer may be present between two or more other layers of the resilient dielectric body.

When the dimensional stability layer is present on first surface 22 of the resilient dielectric body, the dimensional stability layer may cover and/or encapsulate at least a portion of beam structure 44 of rocking beam electrical conduit 42, while probe tip 46 of the rocking beam electrical conduit may extend through the dimensional stability layer, which may serve to anchor, or retain, the rocking beam electrical conduit within the electrical interposer. It is within the scope of the present disclosure that layers 26 may be operatively attached and/or affixed to one other, such as by adhesion. However, it is also within the scope of the present disclosure that layers 26 may be proximal to and/or in mechanical contact with one another but not adhered, or otherwise affixed, to one another.

Figure 10:
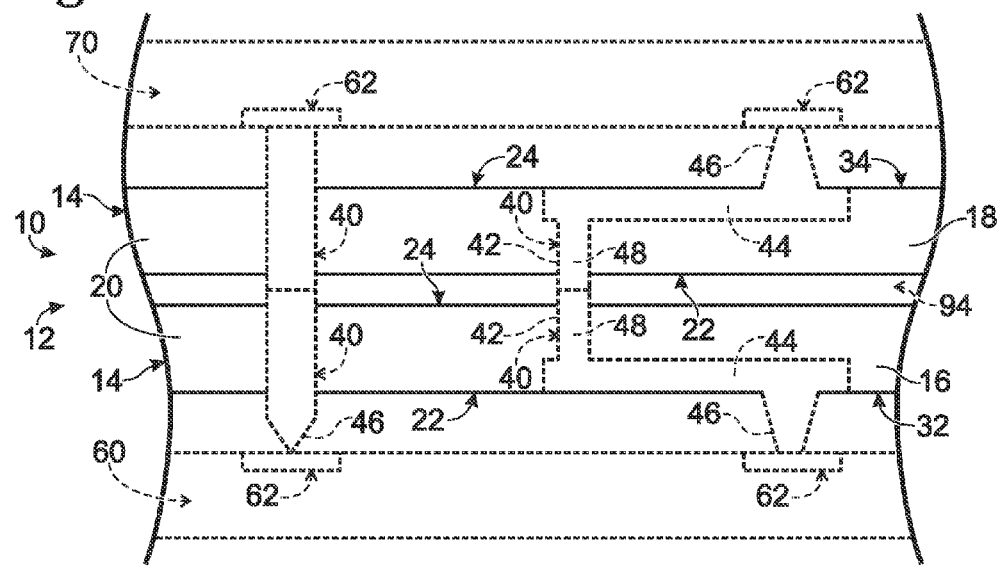
FIG. 10 is a schematic representation of illustrative, non-exclusive examples of a layered interposer according to the present disclosure.

FIG. 10 provides a schematic representation of illustrative, non-exclusive examples of an interposer 10 according to the present disclosure in the form of a layered interposer 12. Layered interposers 12 may include two or more interposer layers 14.

In FIG. 10, layered interposer 12 includes first interposer layer 16 and second interposer layer 18 that is aligned therewith. A gap 94 separates resilient dielectric body 20 of first interposer layer 16 from resilient dielectric body 20 of second interposer layer 18. Electrical conduits 40 of first interposer layer 16 are aligned with respective electrical conduits 40 of second interposer layer 18 to provide for the formation of a composite electrical conduit between first surface 32 and second surface 34 of the layered interposer.

Interposer layers 14 may be arranged such that first surface 22 of first interposer layer 16 forms first surface 32 of the layered electrical interposer, while second surface 24 of first interposer layer 16 is proximal to and/or in electrical communication with first surface 22 of second interposer layer 18. In addition, second surface 24 of second interposer layer 18 forms second surface 34 of the layered electrical interposer.

FIG. 10 illustrates two interposer layers 14. However, it is within the scope of the present disclosure that layered interposer 12 may include any suitable number of interposer layers 14, including 3, 4, 5, 6, 7, or more than 7 interposer layers 14, such as through the inclusion of one or more intermediate interposer layers between first interposer layer 16 and second interposer layer 18.

Interposer layers 14 may include any suitable interposer and/or interposer structures, including the illustrative, non-exclusive examples of interposers 10 and/or interposer structures that are discussed in more detail herein. It is within the scope of the present disclosure that each interposer layer 14 of layered interposer 12 may be similar to, be a mirror image of, and/or include similar structures and/or materials of construction as the other interposer layers of the layered interposer. However, it is also within the scope of the present disclosure that at least one interposer layer 14 of layered interposer 12 may include different structures and/or materials of construction than at least one other interposer layer 14.

Gap 94 may include any suitable structure that is configured to provide for deformation of at least a portion of first interposer layer 16, such as resilient dielectric body 20 thereof, without deformation of a corresponding portion of second interposer layer 18, such as resilient dielectric layer 20 thereof. As an illustrative, non-exclusive example, gap 94 may include an air gap. As another illustrative, non-exclusive example, gap 94 may include a filled gap that includes a dielectric material that is configured to be compressed between first interposer layer 16 and second interposer layer 18, an illustrative, non-exclusive example of which includes a dielectric foam.

As discussed in more detail herein, layered interposer 12 is configured to be compressed between first device 60 and second device 70 and to form a plurality of electrical connections therebetween. It is within the scope of the present disclosure that layered electrical interposer 12 may provide increased compliance, or compression, without damage to the layered interposer 12, first device 60, and/or second device 70 when compared to an interposer that is substantially similar to individual interposer layers 14 of the layered interposer 12 but that does not include the plurality of interposer layers. As illustrative, non-exclusive examples, layered interposer 12 may be configured to be compressed a compression distance of at least 10, at least 20, at least 30, at least 40, at least 50, at least 60, at least 70, at least 80, at least 90, at least 100, at least 125, at least 150, at least 200, or at least 250 micrometers.

Figure 11:
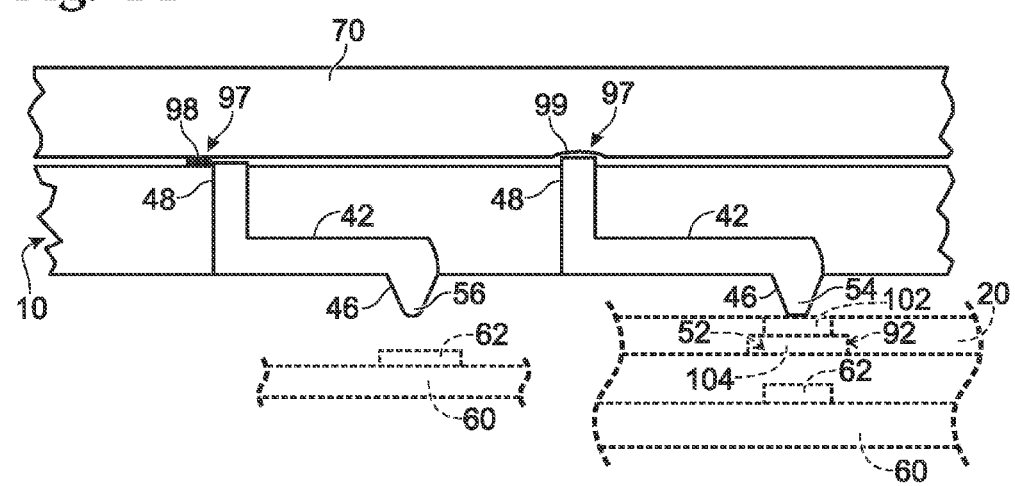
FIG. 11 is a schematic representation of illustrative, non-exclusive examples of an electrical interposer according to the present disclosure that may include a plurality of beam contact locating structures, a plurality of probe tip shapes, and/or a plurality of contact structures.

FIG. 11 provides a schematic representation of illustrative, non-exclusive examples of an electrical interposer 10 according to the present disclosure that may include a plurality of probe tip shapes and/or may include and/or be in mechanical and/or electrical communication with a plurality of beam contact locating structures 97 and/or a plurality of contact structures 92. As discussed in more detail herein, rocking beam electrical conduits 42 may be configured to provide a scrubbing action between probe tip 46 thereof and contact pad 62 of first device 60.

However, first device 60 may not be configured to provide for the scrubbing action, such as when contact pad 62 includes a thin contact pad and/or a contact pad that may be formed from a soft material. Additionally or alternatively, contact pad 62 and/or probe tip 46 may comprise a noble material and the oxide film may not form thereon. Thus, electrical interposers 10 also may include and/or be in mechanical and/or electrical communication with a plurality of contact structures 92 that may be configured to decrease a mechanical wear and/or abrasion of contact pads 62 due to the formation of the electrical communication with electrical interposer 10.

As an illustrative, non-exclusive example, and as shown in FIG. 11, contact structure 92 may be present between probe tip 46 and contact pad 62. When the contact structure is present between probe tip 46 and contact pad 62, the scrubbing action of probe tip 46 may be performed on contact structure 92. Thus, contact pad 62 may be moved into electrical communication with contact structure 92 without, or without substantial, relative motion, wear, and/or abrasion therebetween.

It is within the scope of the present disclosure that contact structure 92 may be associated with a resilient dielectric body 20 that may be separate from and/or form a portion of electrical interposer 10. It is also within the scope of the present disclosure that contact structure 92 may include one or more anchor structures 52 that are configured to retain the contact structure within the resilient dielectric membrane.

Illustrative, non-exclusive examples of anchor structures 52 according to the present disclosure include any suitable structure that may serve to retain the contact structure within the resilient dielectric membrane, an illustrative, non-exclusive example of which includes first and second opposed elliptical cross-sections, wherein a top portion 102 of the cross-section of contact structure 92 that is shown in FIG. 11 is taken along a narrow axis of the first opposed elliptical cross-section, while a bottom portion 104 of the cross-section of contact structure 92 that is shown in FIG. 11 is taken along a wide axis of the second opposed elliptical cross section. Other opposed geometric configurations may be used in addition to, or in place of, the illustrative, non-exclusive example of elliptical shapes.

As shown in FIG. 11, second device 70 may include one or more beam contact locating structures 97, which also may be referred to herein as locating structures 97, that are configured to index, fix, register, align, restrain and/or locate beam contacts 48 with respect to a corresponding location on second device 70. Illustrative, non-exclusive examples of locating structures 97 according to the present disclosure include any suitable post 98 and/or detent 99 that is configured to accept and/or mechanically interact with beam contact 48.

As also shown in FIG. 11, probe tips 46 according to the present disclosure may include any suitable shape and/or profile. As illustrative, non-exclusive examples, probe tips 46 may include blunt profiles 54, arcuate profiles 56, and/or sharp profiles. Illustrative, non-exclusive examples of arcuate probe tip shapes according to the present disclosure include any suitable rounded, hemispherical, and/or inverse convolute profile and/or shape.

Blunt profiles 54 and/or arcuate profiles 56 may decrease wear and/or abrasion of contact pads 62 when probe tips 46 form the electrical connection therewith. However, the blunt and/or arcuate profiles also may decrease the scrubbing action, thereby increasing a potential for high contact resistances between the probe tips and the contact pads. In contrast, sharp probe tips may increase the wear and/or abrasion of the contact pads. However, this increased wear and/or abrasion may not be desired in all systems, such as in systems that provide for the repeated formation of electrical contact between the probe tips and the contact pads.

It is within the scope of the present disclosure that probe tips 46 and contact pads 62 may include any suitable relative size. As an illustrative, non-exclusive example, and as shown in FIG. 11, the probe tips may be significantly smaller than the contact pads. As another illustrative, non-exclusive example, a characteristic dimension of the probe tip may be larger than a characteristic dimension of the contact pad with which it is configured to form the electrical connection. Illustrative, non-exclusive examples of characteristic dimensions of probe tips 46 according to the present disclosure include any suitable diameter of the probe tip, effective diameter of the probe tip, radius of the probe tip, and/or effective radius of the probe tip. Illustrative, non-exclusive examples of characteristic dimensions of contact pads 62 according to the present disclosure include any suitable length, width, diameter, and/or radius of the contact pad.

Figure 12:
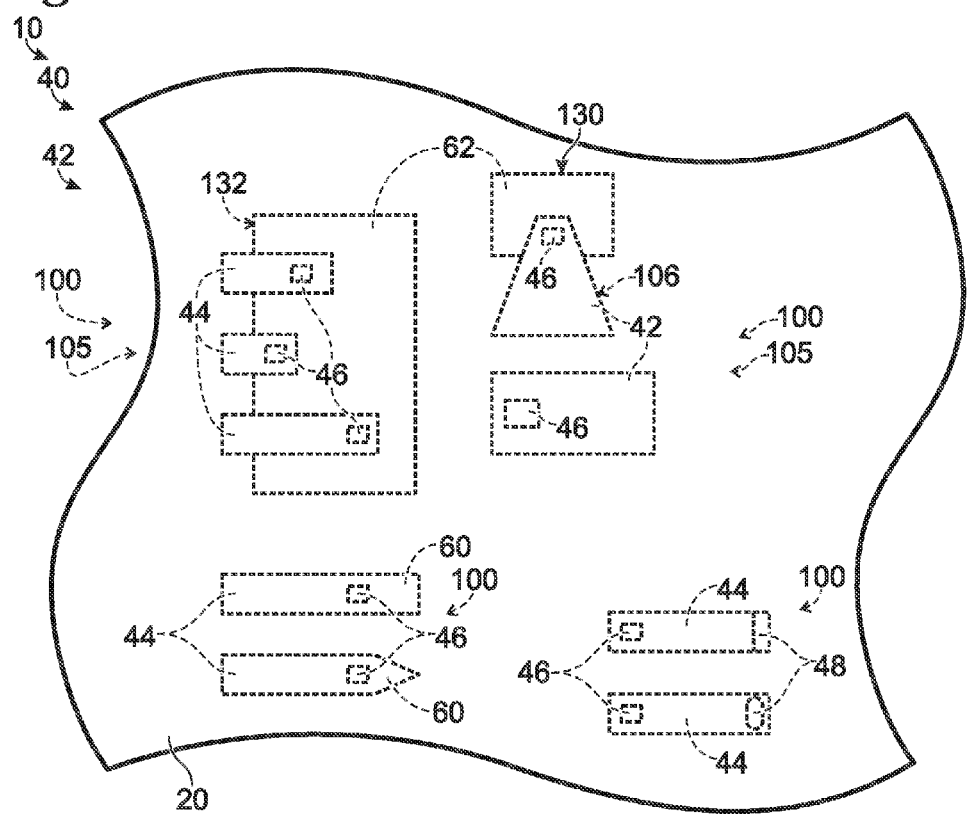
FIG. 12 is a schematic representation of illustrative, non-exclusive examples of beam shape variations, beam contact shape variations, and/or electrical conduit to contact pad conformations according to the present disclosure.

FIG. 12 is a top view of an electrical interposer 10 according to the present disclosure and provides a schematic representation of illustrative, non-exclusive examples of beam shape variations, beam contact shape variations, and/or electrical conduit to contact pad conformation variations. FIG. 12 illustrates that any suitable number of electrical conduits 40 and/or probe tips 46 may be utilized to form the electrical connection with a given contact pad 62. As an illustrative, non-exclusive example, and as shown at 130, a single electrical conduit 40 may form the electrical connection with a given contact pad. As another illustrative, non-exclusive example, and as shown at 132, a plurality of electrical conduits 40 may form the electrical connection with a given contact pad. It is within the scope of the present disclosure that any suitable number of electrical conduits may form the electrical connection with a given contact pad, including 2, 3, 4, 5, 10, 2-5, 2-10, or more than 10 electrical conduits.

FIG. 12 further illustrates that electrical conduits 40 and/or beam structures 44 thereof may include any suitable shape and/or conformation and/or may include one or more compliance modifying structures 100 that are associated with rocking beam electrical conduit 42. As illustrative, non-exclusive examples, and as shown by the plurality of beam conformations that are illustrated in FIG. 12 and indicated at 105, a length and/or width of beam 44 may vary in order to provide for a desired compliance. As another illustrative, non-exclusive example, and as shown at 106, beam 44 may include a non-rectangular cross-sectional shape. As another illustrative, non-exclusive example, beam 44 may include a beam extension 61, such as a rectangular and/or triangular beam extension 61, that may be configured to increase an interaction between electrical conduit 40 and resilient dielectric body 20. As yet another illustrative, non-exclusive example, beam 44 may include a beam contact 48 with a non-circular cross-sectional shape that is configured to increase a distance between a central axis of probe tip 46 and a central axis of beam contact 48 for a given length of beam 44.

The above variations in the conformation of electrical conduits 40 may provide for variation in the restoring force that is applied to electrical conduits 40 by resilient dielectric body 20, and/or the contact force that is applied to contact pad 62 by tip 46. In addition, the above variations in beam shape and/or conformation also may be utilized to increase a density of electrical contacts with a given spacing, pitch, or density, within electrical interposer 10 while maintaining a desired restoring force and/or contact force by tailoring a shape of a given electrical conduit to the space that may be available therefor.

Figure 13:
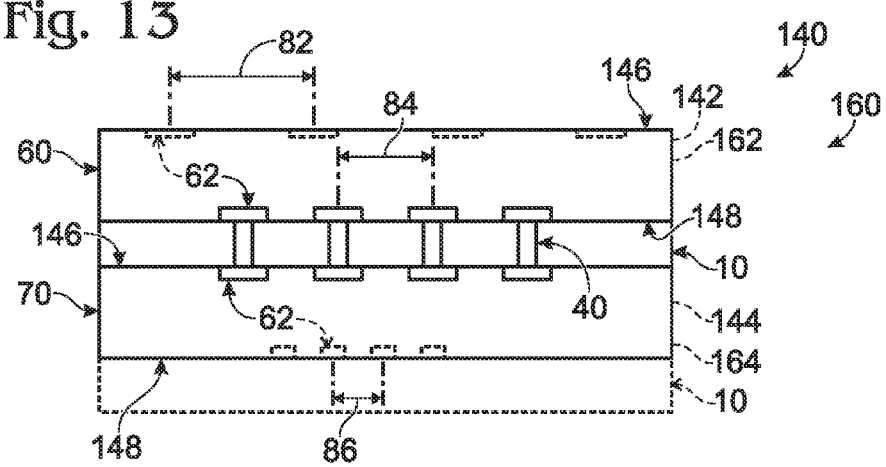
FIG. 13 is a schematic representation of illustrative, non-exclusive examples of an electrical interposer according to the present disclosure that may form a portion of a composite space transformer and/or a three-dimensional integrated circuit.
Figure 14:
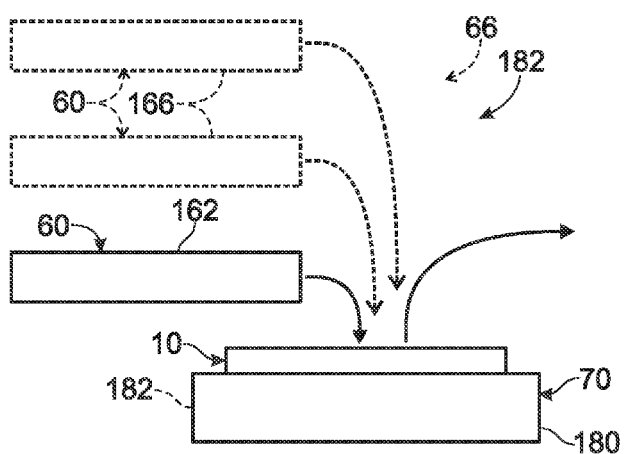
FIG. 14 is a schematic representation of an illustrative, non-exclusive example of a socket according to the present disclosure that may be utilized to package and/or test one or more integrated circuit chips.

FIGS. 13-14 provide illustrative, non-exclusive examples of systems that may include and/or utilize electrical interposers 10 according to the present disclosure. FIG. 13 provides a schematic representation of illustrative, non-exclusive examples of an electrical interposer 10 according to the present disclosure that may form a portion of a composite space transformer 140 and/or a three-dimensional integrated circuit (3-D IC) 160. In FIG. 13, electrical interposer 10, which includes a plurality of electrical conduits 40, is operatively attached to, and forms a plurality of, electrical connections between first device 60 and second device 70.

The electrical interposer may be operatively attached to first device 60 and/or second device 70 in any suitable manner. As an illustrative, non-exclusive example, the electrical interposer may be adhered to one and/or both of first device 60 and second device 70. As another illustrative, non-exclusive example, the electrical interposer may be mechanically pressed into electrical communication with one and/or both of first device 60 and second device 70. It is within the scope of the present disclosure that electrical interposer 10 may be permanently attached to the first device and/or the second device; however, it is also within the scope of the present disclosure that the electrical interposer may be configured to be separated from first device 60 and/or second device 70 without damage to the electrical interposer, first device 60, and/or second device 70.

As an illustrative, non-exclusive example, electrical interposer 10 may be configured to be dissolved from between first device 60 and second device 70. As another illustrative, non-exclusive example, the plurality of electrical connections may be maintained by mechanically pressing the first device and the second device together and the devices may be separated by ceasing the mechanical pressing. As another illustrative, non-exclusive example, the devices may be disassembled to rework and/or replace first device 60, second device 70, and/or interconnect structure 10.

Composite space transformer 140 may be configured to provide a plurality of electrical connections between a first electrical device that includes a plurality of electrical contact pads that are spaced at a first pitch 82 and a second electrical device that includes a plurality of contact pads that are spaced at a second pitch 86 that is less than the first pitch. If the first pitch is significantly larger than the second pitch, it may be difficult to construct a single space transformer that may accommodate the large pitch change, and/or composite space transformer 140 may be more cost effective and/or more efficient than a single space transformer.

When FIG. 13 represents composite space transformer 140, first device 60 may include a first space transformer 142. First space transformer 142 may include a first surface 146 that includes the plurality of electrical contacts 62 that are spaced at first pitch 82 and a second surface 148 that includes a first plurality of electrical contacts 62 that are spaced at an intermediate pitch 84 that is between the first pitch and the second pitch. As an illustrative, non-exclusive example, first space transformer 142 may be constructed using conventional space transformer construction techniques.

Furthermore, second device 70 may include a second space transformer 144. Second space transformer 144 may include a first surface 146 that includes a second plurality of electrical contacts 62 that are spaced at intermediate pitch 84, and a second surface 148 that includes the plurality of electrical contacts 62 that are spaced at second pitch 86. As an illustrative, non-exclusive example, second space transformer 144 may be constructed on a semiconductor wafer and/or using semiconductor manufacturing techniques to provide for the relatively smaller spacing of second pitch 86.

Electrical interposer 10 may form the plurality of electrical connections between second surface 148 of first space transformer 142 and first surface 146 of second space transformer 144. As shown in dashed lines in FIG. 13, composite space transformer 140 further may include one or more additional electrical interposers 10 that may be configured to provide an electrical connection between the composite space transformer and another device.

3-D IC 160 of FIG. 13 may include a plurality of discrete integrated circuit devices (IC devices), which also may be referred to herein as tiers and/or layers of the 3D IC. When FIG. 13 represents 3-D IC 160, first device 60 may include a first IC device 162 and second device 70 may include a second IC device 164, each of which may include a plurality of contact pads 62 that are configured to transfer a plurality of electric currents between the first IC device and the second IC device. Interposer 10, which as discussed also may be referred to herein as interconnect structure 10, may form a plurality of electrical connections between the plurality of contact pads associated with first IC device 162 and the plurality of respective contact pads associated with second IC device 164 to transfer the plurality of electric currents therebetween.

Although 3-D IC 160 of FIG. 13 is illustrated as including two IC devices, it is within the scope of the present disclosure that 3-D IC 160 may include any suitable number of IC devices, including 3, 4, 5, 6, 7, 8, 9, 10, or more than 10 IC devices. As an illustrative, non-exclusive example, and as shown in dashed lines in FIG. 13, the 3-D IC may include a second interconnect structure 10 and a third IC device may be attached thereto. Additionally or alternatively, the second interconnect structure may be utilized to form a plurality of electrical connections between the 3-D IC and another device, illustrative, non-exclusive examples of which include a printed circuit board and/or a socket that is configured to mount the 3-D IC within an electronic device and/or system.

FIG. 14 provides a schematic representation of an illustrative, non-exclusive example of a second device 70, such as a socket 180, according to the present disclosure that may be utilized to package and/or test one or more first devices 60, such as one or more IC devices 182. Socket 180 may form a portion of test system 1 and/or probe head assembly 2 (shown in FIG. 1). Additionally or alternatively, socket 180 may be utilized during the packaging and/or assembly of IC devices 182.

In FIG. 14, electrical interposer 10, which also may be referred to herein as interconnect structure 10, may provide a plurality of electrical connections between socket 180 and integrated circuit device 182. As discussed in more detail herein, socket 180 may be maintained in electrical communication with IC device 182 using any suitable system and/or method, illustrative, non-exclusive examples of which include adhesive bonding and/or mechanical pressing.

When socket 180 is utilized during packaging and/or assembly of IC device 182, the socket may be configured to be in permanent, or at least substantially permanent, electrical communication with the IC device. However, it is within the scope of the present disclosure that the socket may be configured to be separated from the IC device, such as to rework, repair, and/or replace the socket and/or the IC device, and that the illustrative, non-exclusive examples of attachment and detachment structures and method described herein may be utilized to do so.

When socket 180 is utilized during testing of IC device 182, interconnect structure 10 may be permanently, or at least substantially permanently, attached to socket 180 and may be brought into temporary electrical connection with a device under test 66, such as one or more IC devices 182. As shown in FIG. 14, socket 180 may initially be brought into electrical connection with a first IC device 162 and may subsequently be brought into electrical communication with one or more subsequent IC devices 166. While socket 180 is in electrical communication with the IC devices, test system 1 and/or probe head assembly 2 (shown in FIG. 1) may provide a plurality of test signals to the IC devices and/or receive a plurality of resultant signals from the IC devices to test the operation thereof.

Socket 180 may include an interposer structure that is configured to transfer the plurality of electric currents between the IC devices and test system 1 and/or probe head assembly 2 (shown in FIG. 1). Additionally or alternatively, socket 180 also may include and/or be an IC device 182. As an illustrative, non-exclusive example, IC devices 182 may form a portion of a 3-D IC, with socket 180 representing a first tier of the 3-D IC and first and/or subsequent IC devices 162 and/or 166 representing a second tier of the 3-D IC that is configured to operate in conjunction with the first tier. Under these conditions, socket 180 may include active and/or passive electronic components, such as logic and/or memory circuitry that may interact with complementary electronic components that may be present in first and/or subsequent IC devices 162 and/or 166.

FIG. 15 is a process flow depicting illustrative, non-exclusive examples of methods of manufacturing an electrical interposer 10 according to the present disclosure. The process flow of FIG. 15 may include the formation of a plurality of first openings 304 on a substrate 302 at 300. At 305, a first layer of photoresist 307 may be applied to the substrate and patterned to produce a plurality of second openings 312, as shown at 310. At 315, first openings 304 and second openings 312 may be filled with a first conductive material 317 to form a first portion of a rocking beam electrical conduit 42, such as beam structure 44 and probe tip 46 thereof. At 320, first conductive material 317 may be polished to a desired thickness and/or planarity, and a second layer of photoresist 322 may be applied to the substrate and patterned to produce a third opening 324. At 325, the second opening may be filled with a second conductive material 327 to define beam contact 48 and/or a portion thereof, while at 330, second conductive material 327 may be polished to produce a desired length for beam contact 48. At 335, first layer of photoresist 307 and second layer of photoresist 322 are removed to produce a rocking beam electrical conduit 42 that is attached to substrate 302. At 340, an adhesive layer 342 optionally may be applied to substrate 302 and/or rocking beam electrical conduit 42.

At 345, an elastomeric layer 347 optionally may be formed on a carrier surface 348 and pressed into contact with substrate 302 and rocking beam electrical conduit 42, as shown at 350. Alternatively, and as shown at 349, elastomeric layer 347 may be formed on and/or applied to substrate 302, and carrier surface 348 may be pressed into contact with the elastomeric layer, as shown at 350. At 355, substrate 302 and carrier surface 348 may be removed to produce electrical interposer 10.

Substrate 302 may include any suitable material, illustrative, non-exclusive examples of which include a crystalline material, a semiconductor material, a silicon material, a glass material, a metallic material, copper, and/or a material with a low coefficient of thermal expansion. First openings 304 may be formed in substrate 302 using any suitable process. As an illustrative, non-exclusive example, the first opening may be etched into the substrate. As another illustrative, non-exclusive example, the first opening may be formed using a mechanical dimpling process. An illustrative, non-exclusive example of a method for forming first opening 304 is disclosed in U.S. Pat. No. 6,256,882, the complete disclosure of which is hereby incorporated by reference. Applying the first layer of photoresist at 305, applying the second layer of photoresist at 320, forming the second opening at 310, and/or forming the third opening at 320 may be accomplished using any suitable photolithographic technique, illustrative, non-exclusive examples of which include spin coating, patterning, exposing, and/or developing.

First conductive material 317 may include any suitable conductive material, illustrative, non-exclusive examples of which include any suitable metal and/or a rhodium nickel alloy. Similarly, second conductive material 327 may include any suitable conductive material, illustrative, non-exclusive examples of which include any suitable metal, copper, nickel, gold, and/or alloys thereof. Polishing the first conductive material at 320 and/or the second conductive material at 330 may include the use of any suitable method and/or technique to polish, smooth, decrease a thickness of and/or increase a uniformity of the first conductive material and/or the second conductive material. As an illustrative, non-exclusive example, the polishing may include chemical mechanical polishing (CMP).

Elastomeric layer 347 may include any suitable elastomer, illustrative, non-exclusive examples of which are discussed in more detail herein. Forming the elastomeric layer on the carrier surface at 345 may include the use of any suitable system and/or method to form the elastomeric layer, illustrative, non-exclusive examples of which include casting, applying, and/or spin-coating. It is within the scope of the present disclosure that forming the elastomeric layer also may include curing the elastomeric layer. In addition, pressing the elastomeric layer into contact with substrate 302 and rocking beam electrical conduit 42 at 345 may include embedding the rocking beam electrical conduit into the elastomeric layer such that beam contact 48 contacts carrier surface 348 and/or forming an adhesive bond between rocking beam electrical conduit 42 and elastomeric layer 347.

Forming the elastomeric layer on substrate 302 at 349 may include the use of any suitable method to form the elastomeric layer, illustrative, non-exclusive examples of which are discussed in more detail herein. In addition, pressing the carrier surface into contact with the elastomeric layer may include contacting beam contact 48 with carrier surface 348. It is within the scope of the present disclosure that the elastomeric layer may be cured subsequent to pressing the carrier surface into contact with the elastomeric layer at 349 and that curing the elastomeric layer may include forming an adhesive bond between the elastomeric layer and the rocking beam electrical conduit.

Carrier surface 348 may include any suitable surface and/or material, illustrative, non-exclusive examples of which are discussed in more detail herein with reference to substrate 302. In addition, carrier surface 348 may include any suitable surface roughness, including a root mean square surface roughness of less than 10, less than 8, less than 6, less than 4, less than 2, less than 1, or less than 0.5 nanometers.

The pressing at 345 and/or 349 may include pressing with any suitable force and/or pressure. As an illustrative, non-exclusive example, the pressing may include pressing with a pressure of at least 10, at least 12, at least 14, at least 16, at least 18, or at least 20 megapascals.

Removing the substrate and the carrier surface from the electrical interposer at 355 may include the use of any suitable process and/or method. As illustrative, non-exclusive examples, the removing may include etching and/or dissolving the carrier surface and/or the substrate.

FIG. 16 is a flowchart depicting methods 400 according to the present disclosure of improving a dimensional stability of an electrical interposer that includes a resilient dielectric body by stretching the electrical interposer and/or the resilient dielectric body thereof. As discussed in more detail herein, methods 400 may include supplying an electrical interposer in an undeformed state, or configuration, at 410, stretching the electrical interposer to a deformed, or stretched, state, or configuration, at 420, applying the stretched electrical interposer to a space transformer at 430, and/or retaining the stretched electrical interposer in the stretched configuration at 440.

Supplying the electrical interposer at 410 may include supplying any suitable electrical interposer that includes a resilient dielectric body, illustrative, non-exclusive examples of which are discussed in more detail herein. Stretching the electrical interposer at 420 may include the use of any suitable structure and/or method to stretch the electrical interposer to the deformed state. Applying the stretched electrical interposer at 430 may include aligning a plurality of electrical conduits that are associated with the stretched electrical interposer with a plurality of contact pads that may be present on the space transformer and establishing electrical communication between the plurality of electrical conduits and the plurality of contact pads. Retaining the stretched electrical interposer in the stretched configuration at 440 may include the use of any suitable structure and/or method to retain and/or maintain the stretched electrical interposer in the stretched configuration. As an illustrative, non-exclusive example, the retaining may include adhering the stretched electrical interposer to the space transformer. As another illustrative, non-exclusive example, the retaining may include the use of any suitable retention structure, such as a frame.

FIG. 17 is a flowchart depicting methods 500 according to the present disclosure of increasing a vertical compliance of a device under test contacting assembly by stacking a plurality of electrical interposers to form a layered interposer. Methods 500 may include providing a first electrical interposer at 510 and providing a second electrical interposer at 520. The methods further may include aligning the first electrical interposer with the second electrical interposer at 530 and attaching the first electrical interposer to the second electrical interposer to form the layered interposer at 540. In addition, the methods optionally may include applying the layered interposer to a space transformer assembly at 550 and/or maintaining a gap between the first electrical interposer and the second electrical interposer at 560.

Providing the first electrical interposer at 510 and/or the second electrical interposer at 520 may include providing any suitable resilient interposer that may include a resilient dielectric body with a plurality of electrical conduits contained therein, illustrative, non-exclusive examples of which are discussed in more detail herein.

Aligning the first electrical interposer with the second electrical interposer at 530 may include forming a plurality of electrical connections between the plurality of electrical conduits of the first electrical interposer and the plurality of electrical conduits of the second electrical interposer. Attaching the first electrical interposer to the second electrical interposer at 540 may include the use of any suitable system and/or method to operatively attach the first electrical interposer to the second electrical interposer. As an illustrative, non-exclusive example, the attaching may include adhering the first electrical interposer to the second electrical interposer.

Applying the layered electrical interposer to the space transformer assembly at 550 may include operatively attaching the layered electrical interposer to the space transformer assembly. Illustrative, non-exclusive examples of systems and/or methods that may be utilized to operatively attach the layered electrical interposer to the space transformer are discussed in more detail herein. It is within the scope of the present disclosure that the interposer may form a portion of a probe head assembly that may be used in a test system and that the methods also may include probing, testing, and/or establishing electrical communication with a device under test.

Maintaining the gap at 560 may include the use of any suitable structure and/or method to maintain the gap. As an illustrative, non-exclusive example, the maintaining may include maintaining the gap between a first resilient dielectric body that is associated with the first electrical interposer and a second resilient dielectric body that is associated with the second electrical interposer. As an illustrative, non-exclusive example, this may include utilizing any suitable spacer and/or resilient material to maintain the gap.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2)

the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. An electrical interposer, comprising:
a resilient dielectric body, wherein the resilient dielectric body includes a first surface and an opposed second surface; and
a plurality of electrical conduits located within the resilient dielectric body and configured to provide a plurality of electrical connections between a first device that is proximal to the first surface and a second device that is proximal to the second surface, wherein each of the plurality of electrical conduits is configured to deflect upon application of a contact force by at least one of the first device and the second device, and further wherein at least a portion of a restoring force for the plurality of electrical conduits is provided by the resilient dielectric body.

A2. The electrical interposer of paragraph A1, wherein the electrical interposer further includes a means for modifying the restoring force of the plurality of electrical conduits, optionally wherein the means for modifying the restoring force includes a means for increasing the restoring force, and further optionally wherein the means for modifying the restoring force includes a means for decreasing the restoring force.

A3. The electrical interposer of paragraph A2, wherein the means for modifying the restoring force is associated with the resilient dielectric body.

A4. The electrical interposer of any of paragraphs A2-A3, wherein the means for modifying the restoring force is associated with the plurality of electrical conduits.

A5. The electrical interposer of any of paragraphs A1-A4, wherein the electrical interposer further includes a plurality of compliance modifying structures, wherein the plurality of compliance modifying structures are configured to change the restoring force provided to the plurality of electrical conduits, optionally wherein the plurality of compliance modifying structures is configured to increase the restoring force that is provided to the plurality of electrical conduits, and further optionally wherein the plurality of compliance modifying structures is configured to decrease the restoring force that is provided to the plurality of electrical conduits.

A6. The electrical interposer of paragraph A5, wherein the plurality of compliance modifying structures is associated with the resilient dielectric body.

A7. The electrical interposer of any of paragraphs A5-A6, wherein the plurality of compliance modifying structures includes a plurality of compliance modifying regions that include a different composition than a remainder of the resilient dielectric body.

A8. The electrical interposer of paragraph A7, wherein the plurality of compliance modifying regions includes at least one of a different chemical composition, a different density, a different viscoelasticity, a different Young's modulus, and a different yield strain than the remainder of the resilient dielectric body.

A9. The electrical interposer of any of paragraphs A7-A8, wherein the plurality of compliance modifying regions includes at least one of a plurality of voids, a plurality of domains with a different composition than that of the resilient dielectric body, and a plurality of foam domains within the resilient dielectric body.

A10. The electrical interposer of any of paragraphs A7-A9, wherein the plurality of compliance modifying regions at least one of is not uniformly distributed within the resilient dielectric body, is not uniform in a direction that is parallel to at least one of the first surface and the second surface, is systematically distributed within the resilient dielectric body, separates at least a portion of the plurality of electrical conduits from the resilient dielectric body, extends between the first surface and the second surface, and extends in a direction that is at least substantially perpendicular to at least one, and optionally both, of the first surface and the second surface.

A11. The electrical interposer of any of paragraphs A7-A10, wherein the plurality of compliance modifying regions is at least one of located proximal to and in mechanical communication with the plurality of electrical conduits.

A12. The electrical interposer of any of paragraphs A1-A11, wherein the plurality of electrical conduits includes a plurality of rocking beam electrical conduits, wherein the plurality of rocking beam electrical conduits includes a beam structure, wherein the beam structure is at least substantially parallel to at least one of the first surface and the second surface when the resilient dielectric body is in an undeformed configuration, wherein a first end of the beam structure includes a probe tip that extends from the beam structure and is configured to electrically contact the first device, and further wherein an opposed second end of the beam structure includes a beam contact that is configured to electrically contact the second device.

A13. The electrical interposer of paragraph A12 when dependent from any of paragraphs A7-A11, wherein the plurality of compliance modifying regions is at least one of associated with, proximal to, and in mechanical communication with the beam structure, optionally wherein the plurality of compliance modifying regions is configured to at least one of change, decrease, and increase the restoring force for the plurality of electrical conduits, and further optionally wherein the plurality of compliance modifying regions is at least one of associated with, proximal to, and in mechanical communication with at least one of the first end of the beam structure and the second end of the beam structure.

A14. The electrical interposer of any of paragraphs A12-A13, wherein the probe tip extends from the beam structure in a first direction, and further wherein the beam contact extends from the beam structure in a second direction that is generally opposed to the first direction, optionally wherein the probe tip extends past the first surface of the resilient dielectric body, and further optionally wherein the beam contact extends at least flush with the second surface of the resilient dielectric body.

A15. The electrical interposer of paragraph A14 when dependent from any of paragraphs A7-A11, wherein the plurality of compliance modifying regions is at least one of associated with, proximal to, and in mechanical communication with the beam contact, and optionally wherein the plurality of compliance modifying regions is configured to at least one of change, decrease, and increase a scrubbing motion of the probe tip when the probe tip contacts the first device.

A16. The electrical interposer of any of paragraphs A12-A15, wherein the plurality of rocking beam electrical conduits includes at least one of rigid rocking beam electrical conduits, substantially rigid rocking beam electrical conduits, flexible rocking beam electrical conduits, monolithic rocking beam electrical conduits, and composite rocking beam electrical conduits, optionally wherein the beam structure includes at least one of a rigid beam structure, a substantially rigid beam structure, and a flexible beam structure, and further optionally wherein the beam contact includes at least one of a rigid beam contact, a substantially rigid beam contact, and a flexible beam contact.

A17. The electrical interposer of any of paragraphs A12-A16 when dependent from any of paragraphs A5-A11, wherein the plurality of compliance modifying structures includes a beam extension that extends past the probe tip.

A18. The electrical interposer of any of paragraphs A12-A17 when dependent from any of paragraphs A5-A11, wherein the plurality of compliance modifying structures includes a non-rectangular beam shape.

A19. The electrical interposer of any of paragraphs A13-A18 when dependent from any of paragraphs A5-A11, wherein the plurality of compliance modifying structures includes a non-circular beam contact cross-section that is configured to increase a distance between a central axis of the beam contact and a central axis of the probe tip for a given beam length.

A20. The electrical interposer of any of paragraphs A1-A19, wherein the electrical interposer further includes a means for decreasing a planar expansion of the electrical interposer when the electrical interposer is compressed between the first device and the second device.

A21. The electrical interposer of paragraph A20, wherein the means for decreasing the planar expansion of the electrical interposer includes a plurality of expansion pockets configured to decrease the planar expansion of the electrical interposer when the electrical interposer is compressed between the first device and the second device.

A22. The electrical interposer of paragraph A21, wherein the plurality of expansion pockets is located between at least a portion of the plurality of electrical conduits.

A23. The electrical interposer of any of paragraphs A21-A22, wherein the first device includes a plurality of first contact pads configured to form an electrical connection with the plurality of electrical conduits, wherein the second device includes a plurality of second contact pads configured to form an electrical connection with the plurality of electrical conduits, and further wherein the plurality of expansion pockets is configured to provide for compression of the electrical interposer in a region between the plurality of electrical conduits without substantial motion of the plurality of electrical conduits with respect to the plurality of first contact pads and the plurality of second contact pads.

A24. The electrical interposer of any of paragraphs A21-A23, wherein the plurality of expansion pockets extends from the first surface to the second surface.

A25. The electrical interposer of any of paragraphs A21-A24, wherein the plurality of expansion pockets includes a substantially cylindrical shape.

A26. The electrical interposer of any of paragraphs A21-A25, wherein the plurality of expansion pockets includes at least one of a different chemical composition, a different density, a different viscoelasticity, a different Young's modulus, and a different yield strain than a remainder of the resilient dielectric body.

A27. The electrical interposer of any of paragraphs A21-A26, wherein the plurality of expansion pockets includes at least one of a plurality of voids, a plurality of domains with a different composition than that of the resilient dielectric body, and a plurality of foam domains within the resilient dielectric body.

A28. The electrical interposer of any of paragraphs A21-A27, wherein the plurality of expansion pockets is at least one of not uniformly distributed within the resilient dielectric body, not uniform in a direction that is parallel to at least one of the first surface and the second surface, and systematically distributed within the resilient dielectric body.

A29. The electrical interposer of any of paragraphs A20-A28, wherein the means for decreasing the planar expansion of the electrical interposer includes a stretched electrical interposer that is formed at a first size and stretched to a second size that is larger than the first size prior to being compressed between the first device and the second device to decrease planar expansion of the electrical interposer.

A30. The electrical interposer of any of paragraphs A1-A29, wherein each of the plurality of electrical conduits includes a/the probe tip that is configured to electrically contact the first device, and further wherein the probe tip includes at least one of a rounded profile, a hemispherical profile, and an inverse convolute profile that is configured to decrease abrasion of the first device when the probe tip contacts the first device.

A31. The electrical interposer of any of paragraphs A1-A30, wherein each of the plurality of electrical conduits includes a/the probe tip that is configured to electrically contact a respective contact pad on the first device, and further wherein a characteristic dimension of the probe tip is larger than a characteristic dimension of the respective contact pad, optionally wherein the characteristic dimension of the probe tip includes at least one of a diameter of the probe tip and an effective diameter of the probe tip, and further optionally wherein the characteristic dimension of the contact pad includes a length of the contact pad.

A32. The electrical interposer of any of paragraphs A1-A31, wherein the resilient dielectric body includes a plurality of substantially planar dielectric layers.

A33. The electrical interposer of paragraph A32, wherein the resilient dielectric body includes an elastomeric layer and a dimensional stability layer that is configured to maintain the plurality of electrical conduits in a substantially fixed relative orientation within a plane of the resilient dielectric body.

A34. The electrical interposer of paragraph A33, wherein the dimensional stability layer includes a polyimide layer.

A35. The electrical interposer of any of paragraphs A33-A34, wherein the dimensional stability layer is present on the first surface of the resilient dielectric body, further wherein a/the probe tip associated with each the plurality of electrical conduits extends through the dimensional stability layer, and optionally wherein a remainder of each of the plurality of electrical conduits does not extend through the dimensional stability layer.

A36. The electrical interposer of any of paragraphs A33-A34, wherein the dimensional stability layer is present on the second surface of the resilient dielectric body.

A37. The electrical interposer of any of paragraphs A33-A36, wherein the elastomeric layer is a first elastomeric layer, and further wherein the dimensional stability layer is located between the first elastomeric layer and a second elastomeric layer.

A38. The electrical interposer of any of paragraphs A1-A37, wherein the resilient dielectric body is fabricated on a material with a low coefficient of thermal expansion, optionally wherein the resilient dielectric body is removed from the material with a low coefficient of thermal expansion prior to use of the electrical interposer, and further optionally wherein the material with a low coefficient of thermal expansion includes silicon.

A39. The electrical interposer of any of paragraphs A1-A38, wherein at least 2 of the plurality of electrical conduits are configured to provide electrical connections with a single contact pad on the first device, and optionally wherein at least 3, at least 4, at least 5, at least 10, 2-5, or 2-10 of the plurality of electrical conduits are configured to provide electrical connections with a single contact pad on the first device.

A40. The electrical interposer of any of paragraphs A1-A39, wherein the electrical interposer includes the second device, wherein the electrical interposer is operatively attached to the second device, and further wherein the second device includes a locating structure configured to mechanically couple with the plurality of electrical conduits to control an alignment of the plurality of electrical conduits with respect to the second device, and optionally wherein the locating structure includes at least one of a post and a detent.

A41. The electrical interposer of any of paragraphs A1-A40, wherein the electrical interposer includes a cover that is configured to protect the electrical interposer when the electrical interposer is not in electrical communication with the first device, and optionally wherein the cover includes a plurality of recesses that are located to correspond to the plurality of electrical conduits.

A42. The electrical interposer of any of paragraphs A1-A41, wherein the plurality of electrical conduits is configured to be at least one of removed from the electrical interposer, reinserted into the electrical interposer, and selectively replaced without damage to the electrical interposer or the plurality of electrical conduits.

A43. The electrical interposer of any of paragraphs A1-A42, wherein the electrical interposer further includes a plurality of contact structures, wherein each of the plurality of contact structures is associated with a respective one of the plurality of electrical conduits, wherein the plurality of contact structures is located between the plurality of electrical conduits and the first device, and further wherein the plurality of contact structures is configured to decrease abrasion of a surface of the first device when forming the electrical communication between the first device and the electrical interposer.

A44. The electrical interposer of any of paragraphs A1-A43, wherein the resilient dielectric body includes at least one of an elastomer and silicone, and optionally wherein the resilient dielectric body further includes at least one of a foam and a closed-cell foam.

A45. The electrical interposer of any of paragraphs A1-A44, wherein at least one of the first device and the second device includes at least one of a space transformer, an electronic device, an electrical interposer, a device under test, an integrated circuit, a socket, a tier of a three-dimensional integrated circuit, a probe head, a portion of a probe head, a test system, and a portion of a test system, and optionally wherein the electrical interposer includes at least one, and optionally both, of the first device and the second device.

B1. A layered interposer including a first outer surface and an opposed second outer surface, the layered interposer comprising:
    a first electrical interposer, wherein the first electrical interposer includes the electrical interposer of any of paragraphs A1-A45; and
    a second electrical interposer, wherein the second electrical interposer includes the electrical interposer of any of paragraphs A1-A45, wherein a first surface of the first electrical interposer forms the first outer surface of the layered interposer, wherein a second surface of the first electrical interposer is proximal to and in electrical communication with a first surface of the second electrical interposer, wherein a second surface of the second electrical interposer forms the second outer surface of the layered interposer, and further wherein at least a portion of the plurality of electrical conduits of the first electrical interposer is in electrical communication with a respective portion of the plurality of electrical conduits of the second electrical interposer and configured to provide the plurality of electrical connections between the first outer surface and the second outer surface.

B2. The layered interposer of paragraph B1, wherein the layered interposer further includes at least a first intermediate interposer between the first interposer and the second interposer, optionally wherein the layered interposer includes 1, 2, 3, 4, 5, or more than 5 intermediate interposers between the first interposer and the second interposer.

B3. The layered interposer of any of paragraphs B1-B2, wherein the layered interposer further includes a gap between the resilient dielectric body of the first electrical interposer and the resilient dielectric body of the second electrical interposer, and optionally wherein the gap includes at least one of an air gap and a filled gap that includes a dielectric material that is configured to be compressed between the resilient dielectric body of the first electrical interposer and the resilient dielectric body of the second electrical interposer.

B4. The layered interposer of any of paragraphs B1-B3, wherein the layered interposer is configured to be compressed between a first electrical device and a second electrical device, and further wherein a compression distance of the layered electrical interposer is at least 10 micrometers, optionally including compression distances of at least 20, at least 30, at least 40, at least 50, at least 60, at least 70, at least 80, at least 90, at least 100, at least 125, at least 150, at least 200, or at least 250 micrometers.

C1. A membrane configured to provide an electrical connection between a device under test and a probe head, the membrane comprising:
the electrical interposer of any of paragraphs A1-A45 or the layered interposer of any of paragraphs B1-B4.

D1. A coupon configured to provide an electrical connection between a device under test and a probe head assembly, the coupon comprising:
the electrical interposer of any of paragraphs A1-A45, the layered interposer of any of paragraphs B1-B4, or the membrane of paragraph C1.

D2. The coupon of paragraph D1, wherein the first device includes a portion of a probe head assembly, and further wherein the coupon is adhesively bonded to the first device.

E1. A composite space transformer configured to provide a plurality of electrical connections between a first electrical device that includes a plurality of first contact pads spaced at a first pitch and a second electrical device that includes a plurality of second contact pads spaced at a second pitch, wherein the first pitch is greater than the second pitch, the composite space transformer comprising:
a first space transformer including a first space transformer upper surface and a first space transformer lower surface;
an electrical interposer, wherein the electrical interposer includes the electrical interposer of any of paragraphs A1-A45 or the layered interposer of any of paragraphs B1-B4, and further wherein the first surface of the electrical interposer is configured to electrically contact the first space transformer lower surface; and
a second space transformer including a second space transformer upper surface and a second space transformer lower surface, wherein the second space transformer upper surface is configured to electrically contact the second surface of the first electrical interposer.

E2. The composite space transformer of paragraph E1, wherein the first space transformer upper surface includes a plurality of first space transformer upper surface electrical contacts that are spaced at the first pitch, wherein the first space transformer lower surface includes a plurality of first space transformer lower surface electrical contacts that are spaced at an intermediate pitch that is between the first pitch and the second pitch, wherein the second space transformer upper surface includes a plurality of second space transformer upper surface electrical contacts that are spaced at the intermediate pitch, wherein the second space transformer lower surface includes a plurality of second space transformer lower surface electrical contacts that are spaced at the second pitch, and further wherein the electrical interposer is configured to form an electrical connection between the plurality of first space transformer lower surface electrical contacts and the plurality of second space transformer upper surface electrical contacts.

E3. The composite space transformer of any of paragraphs E1-E2, wherein the electrical interposer is a first electrical interposer, and further wherein the composite space transformer further includes a second electrical interposer, wherein the second electrical interposer includes the electrical interposer of any of paragraphs A1-A45 or the layered interposer of any of paragraphs B1-B4, and further wherein the first surface of the second electrical interposer is configured to electrically contact the second space transformer lower surface.

F1. A probe head assembly for electrically contacting a device under test comprising:
a signal conduit that is configured to at least one of provide a test signal to and receive a resultant signal from the device under test;
a space transformer in electrical communication with the signal conduit; and
a probe head, wherein the probe head includes the electrical interposer of any of paragraphs A1-A45, the layered interposer of any of paragraphs B1-B4, the membrane of paragraph C1, the coupon of any of paragraphs D1-D2, or the composite space transformer of any of paragraphs E1-E3, wherein a first surface of the probe head is configured to form an electrical connection with the space transformer, and further wherein a second surface of the probe head is configured to form an electrical connection with the device under test.

G1. A test system comprising:
the probe head of paragraph F1;
a signal generator configured to generate the test signal; and
a signal analyzer configured to analyze the resultant signal.

H1. A packaged electronic device comprising:
an integrated circuit device;
a socket; and
an interconnect structure configured to provide a plurality of electrical connections between the integrated circuit device and the socket, wherein the interconnect structure includes the electrical interposer of any of paragraphs A1-A45, the layered interposer of any of paragraphs B1-B4, the membrane of paragraph C1, the coupon of any of paragraphs D1-D2, or the composite space transformer of any of paragraphs E1-E3.

H2. The packaged electronic device of paragraph H1, wherein the interconnect structure is configured to be adhesively bonded to at least one, and optionally both, of the integrated circuit device and the socket.

H3. The packaged electronic device of any of paragraphs H1-H2, wherein the interconnect structure is configured to provide for separation of the integrated circuit device from the socket without damage to at least one, optionally two, and further optionally all three of the integrated circuit device, the interconnect structure, and the socket.

I1. A three-dimensional integrated circuit comprising:
a first integrated circuit device;
a second integrated circuit device; and
an interconnect structure configured to provide a plurality of electrical connections between the first integrated circuit device and the second integrated circuit device, wherein the interconnect structure includes the electrical interposer of any of paragraphs A1-A45, the layered interposer of any of paragraphs B1-B4, the membrane of paragraph C1, the coupon of any of paragraphs D1-D2, or the composite space transformer of any of paragraphs E1-E3.

I2. The three-dimensional integrated circuit of paragraph I1, wherein the interconnect structure is configured to be adhesively bonded to at least one, and optionally both, of the first integrated circuit device and the second integrated circuit device.

I3. The three-dimensional integrated circuit of any of paragraphs I1-I2, wherein the interconnect structure is configured to provide for separation of the first integrated circuit device from the second integrated circuit device without damage to at least one, optionally two, and further optionally all three, of the first integrated circuit device, the second integrated circuit device, and the interconnect structure.

J1. A method of forming an electrical interposer including a resilient dielectric body that includes an elastomeric layer, the method comprising:
forming a plurality of interposer conduits on a surface of a substrate;
forming the elastomeric layer on a carrier surface, wherein the elastomeric layer includes an exposed surface;
pressing the exposed surface of the elastomeric layer into contact with the surface of the substrate;
embedding the plurality of interposer conduits in the elastomeric layer, wherein the embedding includes mechanically contacting at least a portion of each of the plurality of interposer conduits with the carrier surface;
separating the carrier surface from the elastomeric layer; and
separating the surface of the substrate from the elastomeric layer while leaving the plurality of interposer conduits embedded within the elastomeric layer.

J2. The method of paragraph J1, wherein, prior to the pressing, the method includes applying an adhesive layer to at least one, optionally at least two, and further optionally all three of the surface of the substrate, the plurality of interposer conduits, and the exposed surface of the elastomeric layer.

J3. The method of any of paragraphs J1-J2, wherein forming the elastomeric layer includes curing the elastomeric layer, optionally wherein the curing includes curing the elastomeric layer prior to the pressing, and further optionally wherein forming the elastomeric layer includes at least one of applying the elastomeric layer to the carrier surface and casting the elastomeric layer on the carrier surface.

J4. The method of any of paragraphs J1-J3, wherein the embedding includes forming an adhesive bond between the plurality of interposer conduits and the elastomeric layer.

K1. A method of forming an electrical interposer including a resilient dielectric body that includes an elastomeric layer, the method comprising:
forming a plurality of interposer conduits on a surface of a substrate;
applying the elastomeric layer to the surface of the substrate, wherein the applying includes covering the plurality of interposer conduits with the elastomeric layer, and further wherein the elastomeric layer includes an exposed surface;
pressing a carrier surface onto the exposed surface, wherein the pressing includes mechanically contacting the carrier surface with at least a portion of each of the plurality of interposer conduits;
curing the elastomeric layer;
separating the carrier surface from the elastomeric layer; and
separating the surface of the substrate from the elastomeric layer while leaving the plurality of interposer conduits embedded within the elastomeric layer.

K2. The method of paragraph K1, wherein, prior to applying the elastomeric layer, the method includes applying an adhesive layer to at least one, and optionally both, of the surface of the substrate and the plurality of interposer conduits.

K3. The method of any of paragraphs K1-K2, wherein curing the elastomeric layer includes forming an adhesive bond between the plurality of interposer conduits and the elastomeric layer.

L1. The method of any of paragraphs J1-K3, wherein the pressing includes pressing with a pressing force of at least 10 megapascals, optionally including a pressing force of at least 12, at least 14, at least 16, at least 18, or at least 20 megapascals.

L2. The method of any of paragraphs J1-L1, wherein forming the plurality of interposer conduits includes performing at least one of a deposition process, a lithography process, an etch process, and a mechanical dimpling process.

L3. The method of any of paragraphs J1-L2, wherein at least one of separating the carrier surface from the elastomeric layer and separating the surface of the substrate from the elastomeric layer includes at least one of etching and dissolving at least one of the carrier surface and the substrate.

L4. The method of any of paragraphs J1-L3, wherein the plurality of interposer conduits includes a plurality of rocking beam electrical conduits, wherein the plurality of rocking beam electrical conduits includes a plurality of beam structures, wherein a first end of each of the plurality of beam structures includes a tip that extends from the beam structure and is configured to contact a device under test, and further wherein an opposed second end of each of the plurality of beam structures includes a beam contact that extends from the beam structure.

L5. The method of any of paragraphs J1-L4, wherein the method further includes forming a dimensional stability layer at least one of within the electrical interposer and on a surface of the electrical interposer, wherein the dimensional stability layer is configured to maintain a relative orientation of the plurality of interposer conduits, optionally wherein the dimensional stability layer includes a polyimide layer, and further optionally wherein forming the dimensional stability layer includes at least one of forming the dimensional stability layer prior to the separating and forming the dimensional stability layer subsequent to the separating.

L6. The method of any of paragraphs J1-L5, wherein the substrate includes at least one of a crystalline substrate, a semiconductor substrate, a silicon substrate, a glass substrate, a metallic substrate, and a copper substrate.

L7. The method of any of paragraphs J1-L6, wherein the carrier surface includes a root mean square roughness of less than 10 nanometers, optionally including a root mean square roughness of less than 8, less than 6, less than 4, less than 2, less than 1, or less than 0.5 nanometers.

M1. The electrical interposer of any of paragraphs A1-A45, the layered interposer of any of paragraphs B1-B4, the membrane of paragraph C1, or the coupon of any of paragraphs D1-D2 formed using the method of any of paragraphs J1-L7.

N1. A method of controlling a restoring force that is applied to a probe tip by a resilient dielectric body when the probe tip is deflected from an initial orientation to a deflected orientation through contact with a device under test, wherein the probe tip is embedded in the resilient dielectric body, and further wherein the probe tip is configured to form an electrical connection with the device under test, the method comprising:

forming a compliance modifying region within the resilient dielectric body.

N2. The method of paragraph N1, wherein the compliance modifying region includes at least one of a void, a domain with a different composition than that of the resilient dielectric body, and a foam domain.

N3. The method of any of paragraphs N1-N2, wherein the compliance modifying region includes at least one of a different chemical composition, a different density, a different viscoelasticity, a different Young's modulus, and a different yield strain than a remainder of the resilient dielectric body.

N4. The method of any of paragraphs N1-N3, wherein the compliance modifying region is in mechanical communication with the probe tip.

N5. The method of any of paragraphs N1-N4, wherein the resilient dielectric body includes the resilient dielectric body of the electrical interposer of any of paragraphs A1-A45, the layered interposer of any of paragraphs B1-B4, the membrane of paragraph C1, or the coupon of any of paragraphs D1-D2.

O1. A method of increasing a dimensional stability of a plurality of electrical conduits that are contained within a resilient dielectric body, wherein the resilient dielectric body includes a first surface and an opposed second surface, wherein each of the plurality of electrical conduits extends from the first surface to the second surface, and further wherein the plurality of electrical conduits is configured to form a plurality of electrical connections with a device under test, the method comprising:

supplying the resilient dielectric body in an undeformed configuration;

stretching the resilient dielectric body to a stretched configuration; and applying the resilient dielectric body to a space transformer, wherein the applying includes maintaining the resilient dielectric body in the stretched configuration, and further wherein the applying includes aligning the plurality of electrical conduits with a plurality of respective contact pads on the space transformer.

O2. The method of paragraph O1, wherein the resilient dielectric body includes the resilient dielectric body of the electrical interposer of any of paragraphs A1-A45, the layered interposer of any of paragraphs B1-B4, the membrane of paragraph C1, or the coupon of any of paragraphs D1-D2.

P1. A method of increasing the vertical compliance of a device under test contacting assembly that is configured to form a plurality of electrical connections between a probe head assembly and a device under test, the method comprising:

providing a first electrical interposer, wherein the first electrical interposer includes a first resilient dielectric body with a first plurality of electrical conduits contained therein;

providing a second electrical interposer, wherein the second electrical interposer includes a second resilient dielectric body with a second plurality of electrical conduits contained therein;

aligning the first electrical interposer with the second electrical interposer, wherein the aligning includes forming a plurality of electrical connections between the first plurality of electrical conduits and the second plurality of electrical conduits; and operatively attaching the first electrical interposer to the second electrical interposer to form a layered electrical interposer.

P2. The method of paragraph P1, wherein the method further includes applying the layered electrical interposer to a space transformer of the probe head assembly, and optionally wherein the applying includes adhering the layered electrical interposer to the space transformer of the probe head assembly.

P3. The method of any of paragraphs P1-P2, wherein the method further includes maintaining a gap between the first resilient dielectric body and the second resilient dielectric body.

P4. The method of any of paragraphs P1-P3, wherein the operatively attaching includes adhering the first electrical interposer to the second electrical interposer.

P5. The method of any of paragraphs P1-P4, wherein at least one, and optionally both, of the first electrical interposer and the second electrical interposer includes the electrical interposer of any of paragraphs A1-A45.

Q1. The use of the electrical interposer of any of paragraphs A1-A45, the layered interposer of any of paragraphs B1-B4, the membrane of paragraph C1, the coupon of any of paragraphs D1-D2, the composite space transformer of any of paragraphs E1-E3, the probe head or probe head assembly of paragraph F1, the test system of paragraph G1, the packaged electronic device of any of paragraphs H1-H3, or the three-dimensional integrated circuit of any of paragraphs I1-I3 with the method of any of paragraphs J1-L7 or N1-P5.

Q2. The use of the method of any of paragraphs J1-L7 to form the electrical interposer of any of paragraphs A1-A45, the layered interposer of any of paragraphs B1-B4, the membrane of paragraph C1, the coupon of any of paragraphs D1-D2, the composite space transformer of any of paragraphs E1-E3, the probe head or probe head assembly of paragraph F1, the test system of paragraph G1, the packaged electronic device of any of paragraphs H1-H3, or the three-dimensional integrated circuit of any of paragraphs I1-I3.

Q3. The use of the method of any of paragraphs N1-N5 to control the restoring force that is applied to the probe tip by the resilient dielectric body of the electrical interposer of any of paragraphs A1-A45, the layered interposer of any of paragraphs B1-B4, the membrane of paragraph C1, the coupon of any of paragraphs D1-D2, the composite space transformer of any of paragraphs E1-E3, the probe head or probe head assembly of paragraph F1, the test system of paragraph G1, the packaged electronic device of any of paragraphs H1-H3, or the three-dimensional integrated circuit of any of paragraphs I1-I3.

Q4. The use of the method of any of paragraphs O1-O2 to increase the dimensional stability of the electrical interposer of any of paragraphs A1-A45, the layered interposer of any of paragraphs B1-B4, the membrane of paragraph C1, the coupon of any of paragraphs D1-D2, the composite space transformer of any of paragraphs E1-E3, the probe head or probe head assembly of paragraph F1, the test system of paragraph G1, the packaged electronic device of any of paragraphs H1-H3, or the three-dimensional integrated circuit of any of paragraphs I1-I3.

Q5. The use of the method of any of paragraphs P1-P5 to form the layered interposer of any of paragraphs B1-B4.

Q6. The use of a compliance modifying structure to change a restoring force that is provided to an electrical conduit that is embedded in a resilient dielectric layer by the resilient dielectric layer.

Q7. The use of a plurality of expansion pockets to decrease a planar expansion of a resilient electrical interposer that is compressed between a first device and a second device.

Q8. The use of a layered interposer to increase a vertical compliance of a probe head assembly.

Q9. The use of an electrical interposer that includes a stretched resilient dielectric body to increase a dimensional stability of the electrical interposer when the electrical interposer is compressed between a first device and a second device.

INDUSTRIAL APPLICABILITY

The systems and methods disclosed herein are applicable to the electronics industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of forming an electrical interposer including a resilient dielectric body that includes an elastomeric layer, the method comprising:
   forming a plurality of interposer conduits on a surface of a substrate;
   forming the elastomeric layer on a carrier surface, wherein the elastomeric layer includes an exposed surface;
   pressing the exposed surface of the elastomeric layer and the surface of the substrate into contact with one another;
   embedding the plurality of interposer conduits in the elastomeric layer, wherein the embedding includes mechanically contacting at least a portion of each of the plurality of interposer conduits with the carrier surface;
   separating the carrier surface from the elastomeric layer; and
   separating the surface of the substrate from the elastomeric layer while leaving the plurality of interposer conduits embedded within the elastomeric layer.

2. The method of claim 1, wherein, prior to the pressing, the method includes applying an adhesive layer to at least one of the surface of the substrate, the plurality of interposer conduits, and the exposed surface of the elastomeric layer.

3. The method of claim 1, wherein forming the elastomeric layer includes curing the elastomeric layer.

4. The method of claim 3, wherein the curing includes curing the elastomeric layer prior to the pressing.

5. The method of claim 3, wherein the curing includes curing the elastomeric layer subsequent to the pressing.

6. The method of claim 5, wherein the curing includes forming an adhesive bond between the elastomeric layer and the plurality of interposer conduits.

7. The method of claim 1, wherein the forming the elastomeric layer includes at least one of applying the elastomeric layer to the carrier surface and casting the elastomeric layer on the carrier surface.

8. The method of claim 1, wherein the embedding includes forming an adhesive bond between the plurality of interposer conduits and the elastomeric layer.

9. The method of claim 1, wherein forming the plurality of interposer conduits includes performing at least one of a deposition process, a lithography process, an etch process, and a mechanical dimpling process.

10. The method of claim 1, wherein the separating the carrier surface from the elastomeric layer includes at least one of etching the carrier surface and dissolving the carrier surface.

11. The method of claim 1, wherein the separating the surface of the substrate from the elastomeric layer includes at least one of etching the substrate and dissolving the substrate.

12. The method of claim 1, wherein the plurality of interposer conduits includes a plurality of rocking beam electrical conduits, wherein the plurality of rocking beam electrical conduits includes a plurality of beam structures, wherein a first end of each of the plurality of beam structures includes a tip that extends from the beam structure and is configured to contact a device under test, and further wherein an opposed second end of each of the plurality of beam structures includes a beam contact that extends from the beam structure.

13. The method of claim 12, wherein the forming the plurality of interposer conduits includes polishing the beam structure to a desired thickness and polishing the beam contact to a desired length to produce a desired thickness for the elastomeric layer subsequent to the pressing and the embedding.

14. The method of claim 12, wherein the forming the plurality of interposer conduits includes polishing the beam structure to a desired planarity to produce a desired planarity of the elastomeric layer subsequent to the pressing and the embedding.

15. The method of claim 1, wherein the method further includes forming a dimensional stability layer at least one of within the electrical interposer and on a surface of the electrical interposer, wherein the dimensional stability layer is configured to maintain a relative orientation of the plurality of interposer conduits.

16. The method of claim 15, wherein the dimensional stability layer includes a polyimide layer.

17. The method of claim 15, wherein the forming the dimensional stability layer includes forming the dimensional stability layer prior to the separating.

18. The method of claim 15, wherein the forming the dimensional stability layer includes forming the dimensional stability layer subsequent to the separating.

19. The method of claim 1, wherein the substrate includes at least one of a crystalline substrate, a semiconductor substrate, a silicon substrate, a glass substrate, a metallic substrate, and a copper substrate.

20. The method of claim 1, wherein the forming the plurality of interposer conduits includes polishing the plurality of interposer conduits to a desired thickness to produce a desired thickness for the elastomeric layer subsequent to the pressing and the embedding.

21. A method of forming an electrical interposer including a resilient dielectric body that includes an elastomeric layer, the method comprising:
   forming a plurality of interposer conduits on a surface of a substrate;
   applying the elastomeric layer to the surface of the substrate, wherein the applying includes covering the plurality of interposer conduits with the elastomeric layer, and further wherein the elastomeric layer includes an exposed surface;
   pressing a carrier surface and the exposed surface into contact with one another, wherein the pressing includes mechanically contacting the carrier surface with at least a portion of each of the plurality of interposer conduits;
   curing the elastomeric layer;
   separating the carrier surface from the elastomeric layer; and
   separating the surface of the substrate from the elastomeric layer while leaving the plurality of interposer conduits embedded within the elastomeric layer.

22. The method of claim 21, wherein, prior to applying the elastomeric layer, the method includes applying an adhesive layer to at least one of the surface of the substrate and the plurality of interposer conduits.

23. The method of claim 21, wherein curing the elastomeric layer includes forming an adhesive bond between the plurality of interposer conduits and the elastomeric layer.

* * * * *